(12) United States Patent
Benson

(10) Patent No.: US 11,164,876 B2
(45) Date of Patent: Nov. 2, 2021

(54) ATOM IMPLANTATION FOR PASSIVATION OF PILLAR MATERIAL

(71) Applicant: Micron Technology, Inc., Boise, ID (US)

(72) Inventor: Russell A. Benson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/270,201

(22) Filed: Feb. 7, 2019

(65) Prior Publication Data
US 2020/0258886 A1 Aug. 13, 2020

(51) Int. Cl.
*H01L 27/108* (2006.01)
*H01L 21/311* (2006.01)
*H01L 21/02* (2006.01)

(52) U.S. Cl.
CPC ...... *H01L 27/1087* (2013.01); *H01L 21/0217* (2013.01); *H01L 21/02351* (2013.01); *H01L 21/31111* (2013.01); *H01L 27/10829* (2013.01)

(58) Field of Classification Search
CPC ............ H01L 27/10829; H01L 28/40; H01L 21/0217; H01L 21/02351; H01L 21/31111; H01L 27/1087
USPC ......................................... 257/301; 438/239
See application file for complete search history.

(56) References Cited

U.S. PATENT DOCUMENTS

| | | | | |
|---|---|---|---|---|
| 4,970,580 A | * | 11/1990 | Ishii | H01L 27/10841 257/302 |
| 5,962,195 A | * | 10/1999 | Yen | H01L 21/28123 216/41 |
| 6,716,571 B2 | * | 4/2004 | Gabriel | H01L 21/28123 216/48 |
| 6,724,031 B1 | * | 4/2004 | Akatsu | H01L 27/10841 257/301 |
| 7,531,874 B2 | * | 5/2009 | Son | H01L 21/26513 257/334 |
| 7,564,081 B2 | * | 7/2009 | Zhu | H01L 29/42384 257/288 |
| 7,662,693 B2 | | 2/2010 | Bhattacharyya | |
| 7,871,913 B2 | * | 1/2011 | Shin | H01L 29/4236 257/E21.294 |
| 7,875,529 B2 | | 1/2011 | Forbes et al. | |
| 7,964,463 B2 | * | 6/2011 | Kang | H01L 27/10876 438/270 |
| 8,003,465 B2 | * | 8/2011 | Ohuchi | H01L 21/32137 257/E21.377 |
| 8,039,349 B2 | * | 10/2011 | Hargrove | H01L 29/66795 438/275 |
| 8,039,843 B2 | * | 10/2011 | Inaba | H01L 21/823807 257/64 |

(Continued)

*Primary Examiner* — Jay C Kim
(74) *Attorney, Agent, or Firm* — Brooks, Cameron & Huebsch, PLLC

(57) ABSTRACT

Systems, apparatuses, and methods related to atom implantation for passivation of pillar material are described. An example apparatus includes a pillar of a semiconductor device. The pillar may include a first portion (e.g., a passivation material) formed from silicon nitride and an underlying second portion formed from a conductive material. A region of the first portion opposite from an interface between the first portion and the underlying second portion may be implanted with atoms of an element different from silicon (Si) and nitrogen (N) to enhance passivation of the implanted region.

9 Claims, 10 Drawing Sheets

(56) References Cited

U.S. PATENT DOCUMENTS

| | | | |
|---|---|---|---|
| 8,076,231 B2* | 12/2011 | Saitoh | H01L 29/785 |
| | | | 438/592 |
| 8,092,703 B2* | 1/2012 | Ishibashi | H01L 21/31144 |
| | | | 216/41 |
| 8,192,641 B2* | 6/2012 | Johnson | H01L 21/3086 |
| | | | 216/46 |
| 8,274,777 B2 | 9/2012 | Kiehlbauch | |
| 8,721,797 B2 | 5/2014 | Cheung et al. | |
| 8,741,758 B2* | 6/2014 | Juengling | H01L 27/10802 |
| | | | 438/589 |
| 8,890,255 B2* | 11/2014 | Kanakasabapathy | |
| | | | H01L 29/66795 |
| | | | 257/368 |
| 9,023,715 B2* | 5/2015 | Faul | H01L 29/66803 |
| | | | 438/434 |
| 9,171,904 B2* | 10/2015 | Eneman | H01L 29/165 |
| 9,190,498 B2* | 11/2015 | Brand | H01L 21/02321 |
| 9,281,307 B2* | 3/2016 | Huang | H01L 29/66545 |
| 9,589,811 B2* | 3/2017 | Ruffell | H01L 29/66803 |
| 10,593,557 B2* | 3/2020 | Choi | H01L 21/265 |
| 2005/0093074 A1* | 5/2005 | Anderson | H01L 29/785 |
| | | | 257/365 |

* cited by examiner

ATOM IMPLANTATION FOR PASSIVATION OF PILLAR MATERIAL

TECHNICAL FIELD

The present disclosure relates generally to semiconductor devices and methods, and more particularly to atom implantation for passivation of pillar material.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1:
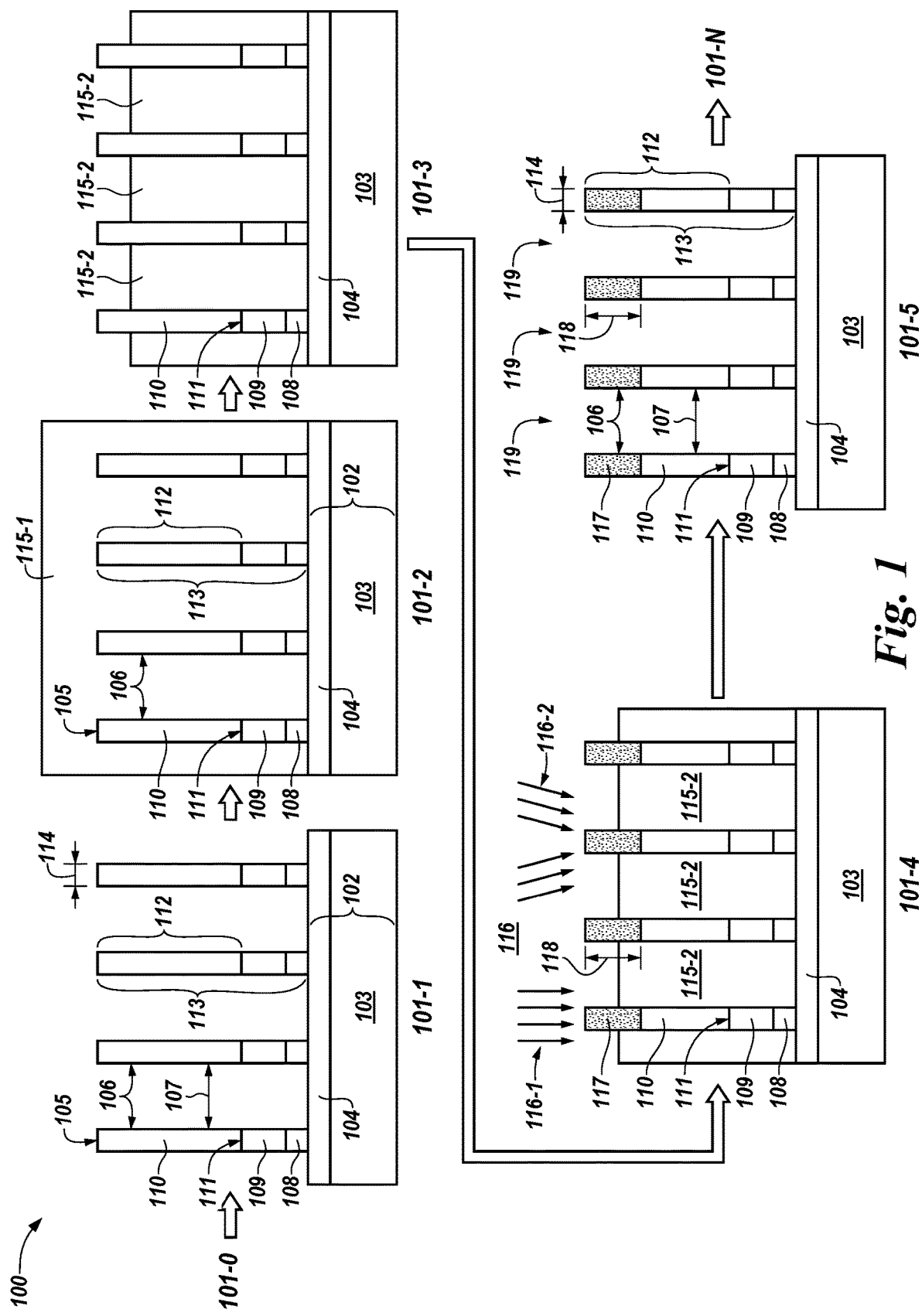
FIG. 1 illustrates a cross-sectional view of a portion of an example memory device at various points in time in an example fabrication sequence for atom implantation for passivation of pillar material in accordance with a number of embodiments of the present disclosure.

Various types of memory devices may have conductive pathways to enable access to various components. The conductive pathways may include electrodes, access lines (e.g., word lines), and sense lines (e.g., bit lines), among other possible conductive pathways. The components accessible via the conductive pathways may include control circuitry, sense amplifiers, memory cells, transistors, and capacitors, among other possible components. The various types of memory devices may have a conductive material (e.g., tungsten (W), copper (Cu), silver (Ag), etc.) of the conductive pathway formed as part of (e.g., within) a pillar of semiconductor materials. Such a pillar may be positioned adjacent an opening to isolate the conductive pathway from conductive pathways of a number of neighboring pillars.

In a number of embodiments, pillars may be formed as separate columns of stacked semiconductor materials having round, square, oblong, etc., cross-sections and that may each extend substantially vertically from a substrate on which they are positioned. The openings adjacent such pillars may be created by spacing the pillars at a predetermined distance from each on the substrate or by positioning the pillars in openings (e.g., indentations) etched at a predetermined distance from each other into the substrate. Alternatively, pillars may be formed as separate walls of stacked semiconductor materials that may each extend substantially vertically from a substrate on which they are positioned. The openings adjacent such pillars may be created by spacing the walls at a predetermined distance from each on the substrate so as to form substantially rectilinear trenches between the pillars.

As used herein, "pillar material" is intended to include various materials (e.g., elements or compounds) that may be formed in one or more layers to form a pillar, as described herein. As used herein, "passivation" is intended to refer to a chemical compound (a passivation material) being formed over a structural material of a semiconductor device in order to provide a barrier to reduce a potential for removal of (e.g., to protect) the structural material resulting from unintended consequences of subsequent processing of the semiconductor device. As described herein, a passivation material may be formed on a top region of a pillar adjacent an opening of a semiconductor device to, for example, protect an underlying conductive material from unintended consequences of processing (fabrication) of the semiconductor device to remove a material associated with the top region of the pillar and/or the opening. However, such processing also may result in removal of an amount (e.g., a thickness, height, and/or mass) of the passivation material. The amount of the passivation material to be removed as such may be included in the original passivation material to enable a remaining passivation material to be sufficient to protect the underlying conductive material from unintended consequences of downstream fabrication.

Increasing the amount of the passivation material on the top region of the pillar adjacent the opening can increase an aspect ratio (AR) of the pillar. The AR described herein is a height of the pillar (e.g., including the heights of various materials and layers in the pillar) divided by a width of the pillar and/or passivation material. However, increasing the AR as such also may have unintended consequences. Such unintended consequences may, for example, include increasing a probability of an unintended bend of the pillar relative to the opening and/or increasing a probability for roughness (e.g., line width roughness (LWR) and/or space width roughness (SWR)) formed on a sidewall of the pillar. The unintended bend or the roughness formed on the sidewall of the pillar may contribute to failure (e.g., a short circuit fault) of the pillar.

Accordingly, the present disclosure describes implanting atoms of an element into the passivation material to form an enhanced passivation material on the top region of the pillar. The enhanced passivation material may be more resistant than the original passivation material to processing to remove another material associated the top region of the pillar and/or the opening. Hence, a lesser amount of the original passivation material may be included in the top region of the pillar because its subsequently enhanced passivation capability may result in reduced removal of the enhanced passivation material prior to downstream processing. The lesser amount (e.g., a thickness, height, and/or mass) used for the original passivation material may, based on a reduced AR of the pillar, reduce a probability of the unintended bend, roughness, or failure of the pillar.

The present disclosure includes systems, apparatuses, and methods related to such atom implantation for passivation of pillar material. An example of an apparatus described herein includes a pillar of a semiconductor device. The pillar may include a first portion (e.g., a passivation material) formed from silicon nitride and an underlying second portion formed from, or to include, a conductive material. A region of the first portion opposite from an interface between the first portion and the underlying second portion may be implanted with atoms of an element different from silicon (Si) and nitrogen (N) to enhance passivation of the implanted region.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the figure number of the drawing and the remaining digits identify an element or component in the drawing. Similar elements or components between different figures may be identified by the use of similar digits. For example, 110 may reference element "10" in FIG. 1, and a similar element may be referenced as 410 in FIG. 4. In some instances, a plurality of similar, but functionally and/or structurally distinguishable, elements or components in the same figure or in different figures may be referenced sequentially with the same element number (e.g., 115-1 and 115-2 in FIG. 1).

FIG. 1 illustrates a cross-sectional view of a portion of an example memory device at various points in time in an example fabrication sequence 100 for atom implantation for passivation of pillar material. The memory devices described herein include the example memory devices shown at 890 and 991 and described in connection with FIG. 8 and FIG. 9, respectively, although embodiments are not intended to be limited to these types of memory devices.

The fabrication sequence 100 illustrated in FIG. 1 is shown at points 101 in time that correspond to processing activities being performed in the fabrication sequence 100 (e.g., by a system 1050 for processing as shown and described in connection with FIG. 10). The points 101 illustrate the structural features after various processing activities have been performed along the fabrication sequence 100. The fabrication sequence 100 may include repetition of particular fabrication processing activities (steps) through a number of iterations (cycles). Other processing activities may have been omitted from FIG. 1 for simplicity. The illustrated processing activities may correspond to formation and removal of structural features.

Formation of structural features may, for example, include formation (e.g., deposition) of a passivation material 110 on a first portion 112 of a pillar 105 of a semiconductor device. The first portion 112 of the pillar 105 is intended to distinguish a position of the passivation material 110 as being different from an underlying second portion formed from a conductive material 109 and a number of other possible portions of the pillar 105 that may be between the conductive material 109 and a substrate material 102 of the pillar 105. For simplicity, the underlying material (e.g., bottom portion 108) and the conductive material 109 of the pillar 105 may both be included in the underlying second portion and may be referred to as the second portion and use reference number "09," as appropriate to the context.

In a number of embodiments, the passivation material 110 may be deposited by a number of wet or dry deposition processes as a layer to form the first portion 112 of the pillar 105. The passivation material 110 may be formed from silicon nitride ($SiN_x$ and/or $Si_3N_4$), although embodiments of the passivation material 110 described herein are not limited to silicon nitride. For simplicity, the different silicon nitride compounds will be subsequently referred to herein as $Si_3N_4$.

Removal of structural features may, as described further herein, include performing a number of processes (e.g., etch processes and/or chemical mechanical polishing processes, among other possible removal processes). Removal of structural features may, in a number of embodiments, include to remove features formed above the passivation material 110, on a sidewall 106 of an opening 107 between pillars 105, and/or of a substrate material 102 at a bottom the opening 107, among other possible positions of structural features.

As described herein, a top region 117 of the first portion 112 opposite from an interface 111 between the first portion 112 and the underlying second portion 109 may be implanted 116 with atoms of an element different from atoms included in the passivation material 110 to enhance passivation of the implanted top region 117. For example, in an embodiment in which the passivation material 110 is formed from $Si_3N_4$, the atoms implanted 116 into the $Si_3N_4$ can be selected from a number of elements different from silicon (Si) and nitrogen (N). The atoms of the selected elements that are different from Si and N may, in a number of embodiments, include at least one of carbon (C), phosphorus (P), boron (B), and arsenic (As), and various mixtures thereof. The atoms that are selected may be implanted as neutral atoms, ionized atoms, or a mixture thereof.

Figure 3:
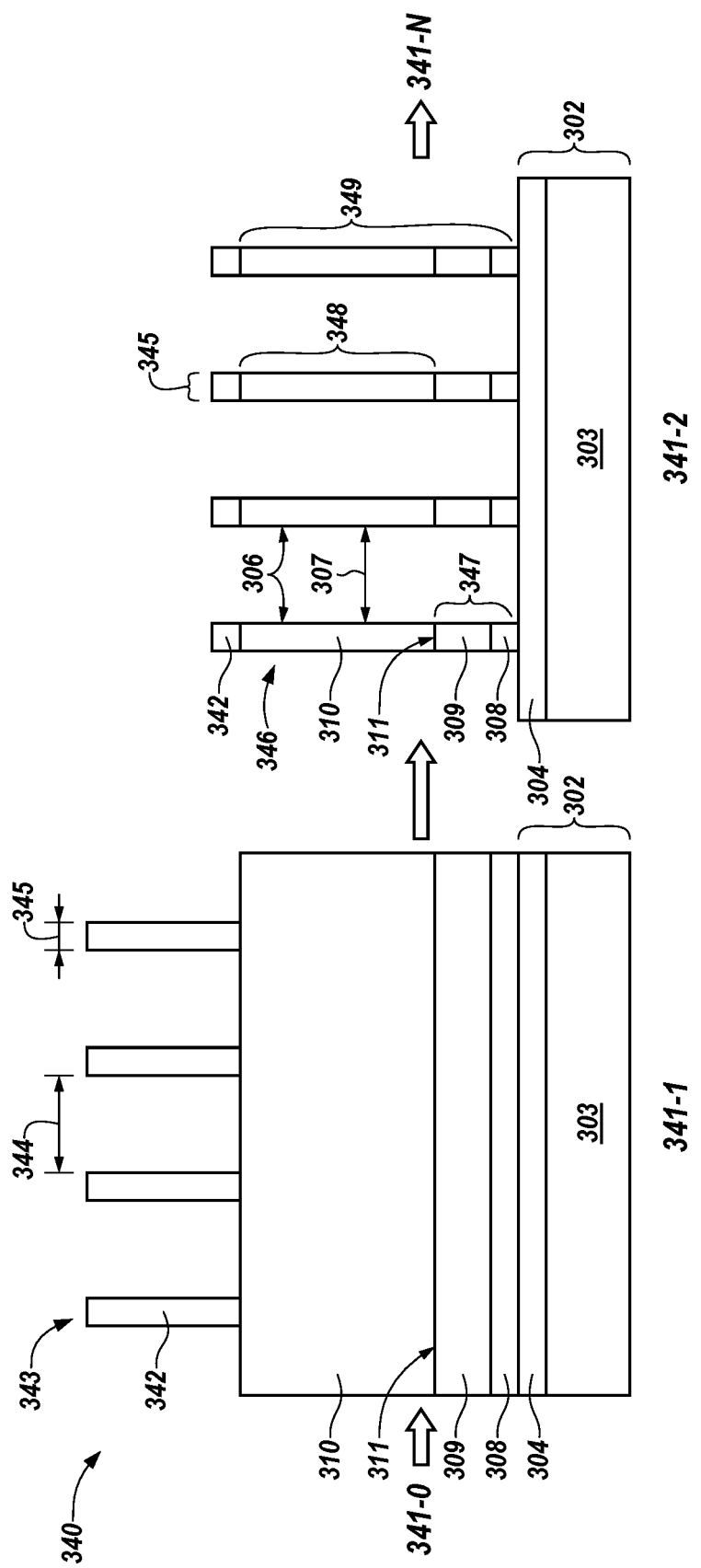
FIG. 3 illustrates a cross-sectional view of a portion of an example memory device in a fabrication sequence upstream from FIG. 1 in accordance with a number of embodiments of the present disclosure.

The points 101 in time illustrated in FIG. 1 begin at point 101-0. Point 101-0 may encompass processing activities in the fabrication sequence 100 that correspond, for example, to processing activities illustrated at points 341-1 and 341-2, and a number of previous processing activities at point 341-0, as shown in FIG. 3. The next point 101-1 in FIG. 1 shows a plurality of pillars 105 of the portion of the example memory device formed on the substrate material 102. The plurality of pillars 105 may be separated by openings 107, as described herein, between the pillars 105. The separation of the pillars 105 provided by the openings 107 may have a width in a range of from around 300 Angstroms (Å) to around 500 A.

The substrate material 102 may, in a number of embodiments, be formed from more than one material such that more than one layer of different materials is used to form a substrate for the pillars 105. The substrate material 102 may, for example, be formed to a thickness in a range of from around 100 A to around 300 A. A first layer 104 of the substrate material 102 contiguous with the pillars 105 may be formed from silicon dioxide ($SiO_2$) and a second layer 103 of the substrate material 102 underlying the first layer 104 may be a wafer formed from $Si_3$. The $SiO_2$ of the first layer 104 and the Si of the second layer 103 each may be formed to a thickness in a range of from around 50 A to around 150 A to yield the 100-300 A thickness of the substrate material 102.

A bottom portion 108 of the pillars 105 contiguous with the substrate material 102 may be formed from, for example, a doped or undoped monocrystalline silicon (monosilicon), polycrystalline silicon (polysilicon), and amorphous silicon, among other possibilities. For simplicity, the bottom portion 108 will be subsequently referred to herein as being formed from polysilicon (poly-Si). The bottom portion 108 may, for example, be formed to a thickness in a range of from around 100 A to around 200 A.

The conductive material 109 (e.g., of the second portion) of the pillar 105 may be formed on a surface of the bottom portion 108 opposite from a surface of the bottom portion 108 contiguous to the substrate material 102. The conductive material 109 may be formed from W, Cu, Ag, among various other conductive materials, and mixtures thereof. The conductive material 109 may, for example, be formed to a thickness in a range of from around 150 A to around 250 A.

The passivation material 110 of the first portion 112 of the pillar 105 may be formed on a surface of the conductive material 109 opposite from the surface of the bottom portion 108 on which the conductive material 109 is formed. The passivation material 110 may, in a number of embodiments, be formed from $Si_3N_4$. The passivation material 110 may, for example, be formed to a thickness in a range of from around 650 A to around 850 A.

Each pillar 105 may be formed to extend to a particular height 113 above an upper surface of the substrate material 102. For example, as just described, a pillar 105 may be formed from a first portion 112 and a second portion 109. Addition of a height of the first portion 112 and a height of the second portion 109 may yield the particular height 113 of the pillar 105. For example, the 650-850 A thickness of the passivation material 110 of the first portion 112 added to the combined thicknesses of 150-250 A for the conductive material 109 and 100-200 A for the bottom portion 108 of the second portion may yield a height 113 of the pillar 105 in a range of from around 900 A to around 1300 A.

The height 113 of a pillar 105 may correspond to a depth of an adjacent opening 107. A width by which each pillar 105 is separated from another pillar may define a width of the opening 107 between sidewalls 106 of the pillars 105. The sidewalls 106 of the pillars 105 may alternatively be termed sidewalls 106 of the opening 107, depending on the context.

Each pillar 105 may be formed to a particular width 114. The width 114 of a pillar 105 may be in a range of from around 70 A to around 100 A. Deposition and etching may be utilized to form the pillars 105, the openings 107, and the defined portions 109, 112, etc. The height and width of the pillars 105, the width of the openings 107, and the thicknesses of the defined portions 109, 112 may vary according to an intended purpose, materials to be formed (e.g., deposited) therein, design rule specifications, etc.

Variation in the height 113 and/or width 114 of the pillar 105 determine an AR of the pillar 105. The AR is determined by the height 113 relative to the width 114 of the pillar 105. For example, a higher AR for a pillar 105 may be associated with a greater difference between a height 113 of the pillar 105 relative to a width 114 of the pillar 105. The AR for the pillars 105 shown in FIG. 1 to be implanted 116 with atoms for enhanced passivation may, for example, be 900 A/70 A=12.9 or 1300 A/100 A=13.0, with other possible lower or higher ARs resulting from variation in the height 113 in the 900-1300 A range relative to the width 114 in the 70-100 A range.

In the context of the present disclosure, given a particular width 114 of a pillar 105, a difference in an AR may be based on the height (thickness) of the passivation material 110 of the first portion 112 of the pillar 105 being less based on the top region 117 of the first portion 112 being implanted 116 with atoms to enhance passivation than an AR resulting from the first portion 112 not being implanted to enhance passivation (e.g., as shown and described in connection with FIGS. 3-5). As described herein, such a reduction in the AR resulting from reduction of the height of the passivation material 110 may enable a reduced probability of an unintended bend, roughness, and/or failure of the pillar 105.

The fabrication sequence 100 illustrated in FIG. 1 shows at the point 101-2 in time that a coating material 115-1 that includes atoms of an element different from the atoms used to originally form the passivation material 110 is formed (e.g., deposited) to fill the openings 107 to at least an upper surface of the first portions 112 of the pillars 105. For example, in embodiments in which the passivation material 110 is formed from $Si_3N_4$, the coating material 115-1 may be formed from, or to include, atoms of elements different from Si and N. The coating material 115-1 may be formed from a level of a substrate material 102 of the pillar 105 to an intended level along a height of sidewalls 106 of the openings 107 in the pillars 105, or above top surfaces of the pillars, to reduce implantation of the atoms through the sidewalls 106 below the intended level. The coating material 115-1 may be selected (e.g., configured) to be removable after the atoms are implanted into the top region 117 of the first portion 112 of the pillar 105. For example, the coating material 115-1 may be selected for and removed by, in a number of embodiments, performance of a number of etch processes and/or exposure to a number of solvents, as described herein.

Various types of materials may be utilized as the coating material 115-1 to fill the openings 107. Selection of a particular coating material 115-1 from among the various types of materials may be based on which of the materials satisfies particular criteria. Such criteria may include being more susceptible to removal than neighboring features of the memory device, such as the first portions 112 and the second portions 109 of the pillars 105 and an upper surface of the substrate material 102. Being more susceptible to removal is intended to mean having less resistance and/or higher selectivity to removal by selected etch processes and/or exposure to selected solvents. The criteria may include having a capacity to evenly fill (e.g., without voids) openings 107 with a high AR (e.g., greater than 7.0) to an intended height. The intended height may, in a number of embodiments, be to an intended level along a sidewall 106 of each of the pillars 105, a top surface of the first portion 112 of the pillars 105, or a selected height above the top surface of the first portion 112 of the pillars 105, as shown for coating material 115-1 at point 101-2 in FIG. 1.

Other criteria may include the coating material 115-1 being formed to include one or more elements or compounds selected to have an ability to block or absorb the particular atoms to be implanted 116 at point 101-4 in the example fabrication sequence 100 illustrated in FIG. 1. For example, the elements or compounds may be selected to have the ability to block or absorb the implanted atoms (e.g., C, P, B, and/or As) such that penetration of the implanted atoms beyond an intended (e.g., selected) depth in the coating material 115-1 is reduced (e.g., prevented). Hence, the coating material 115-1 may enable reduction of implantation 116 of the selected atoms beyond a selected depth 118 in the passivation material 110 of the first portion 112 of the pillar 105, as described further in connection with the 101-4 point in time.

The various types of coating materials 115-1 that satisfy the aforementioned criteria may be formed on the memory device (e.g., at least within the openings 107) by various deposition processes. A coating material 115-1 may, for example, be deposited using spin-on deposition, chemical vapor deposition, plasma-enhanced chemical vapor deposition, pulsed laser deposition, sputter deposition, atomic layer deposition, and/or molecular beam epitaxy, among other suitable deposition processes. The various types of coating materials 115-1 may include inorganic and organic types of compounds. The organic compounds may include spin-on carbon (SOC) coating materials 115-1. The C atoms in the SOC coating materials 115-1 may, in a number of embodiments, contribute to the ability of the coating materials 115-1 to block or absorb the implanted atoms. The composition of the selected SOC coating materials 115-1 may be a compound with C in a range of from around 50-100%, hydrogen (H) in a range of from around 30-45%, and/or oxygen (O) in a range of from around 0-10%. Examples of such compounds that may be used as the SOC coating materials 115-1 include fullerene derivatives that may include allotropes of C formed in a hollow sphere, ellipsoid, tube, among other shapes, and high-C containing (e.g., at least 80% C) polycyclic aryl polymers, among other possible compounds usable as the coating materials 115-1.

Point 101-3 of the fabrication sequence 100 illustrated in FIG. 1 shows an example of the intended level of the coating material 115-2 along the sidewalls 106 and below the top surface of the first portion 112 of each of the pillars 105. The intended level of the coating material 115-2 may, in a number of embodiments, be recessed below the top surface of the first portion 112 in a range of from around 200 A to around 400 A.

The recessed level of the coating material 115-2 may be achieved by performance of a deposition process (e.g., a spin-on process or another deposition process described herein or otherwise) that is designed for and/or continued until reaching the recessed level. Alternatively or in addition, when the height of the coating material 115-1 is above the top surface of the first portion 112, at point 101-2 in FIG. 1, the recessed level of the coating material 115-2 may be achieved by performance of a selective etch process. The selective etch process may have one or more etch chemistries selected from an aqueous etch chemistry, a semi-aqueous etch chemistry, a vapor etch chemistry, or a plasma etch chemistries, among other possible selective etch chemistries. For example, a dry etch chemistry of oxygen ($O_2$) or $O_2$ and sulfur dioxide ($SO_2$) ($O_2/SO_2$) may be utilized to etch a SOC coating material 115-2 to the recessed level.

Point 101-4 of the fabrication sequence 100 illustrated in FIG. 1 shows an example of the selected atoms being implanted 116 in the passivation material 110 of the first portion 112 of the pillars 105. The atoms may be implanted 116 from a source (not shown) positioned above the memory device relative to axes of the pillars 105 and/or openings 107. The source may be a source of the atoms to be implanted and may include an accelerator to accelerate single atoms, ions, or molecules to an intended energy (velocity) toward the passivation material 110 of the first portion 112 of the pillars 105 and toward the recessed level of the coating material 115-2.

The atoms in the top region 117 of the first portion 112 may be implanted 116 to an intended (e.g., selected) depth 118 and/or an intended density after formation of the first portion 112 and the second portion 109 of the pillar 105. The number and/or density of atoms, for example, to be implanted 116 into the top region 117 above the selected depth 118 of the passivation material 110 (e.g., $Si_3N_4$) may be predetermined to enhance the passivation of the implanted top region 117 to an intended level. A capability of achieving the preselected density of atoms implanted into the top region 117 above the selected depth 118 or a time period spent in doing so may be dependent upon an implant energy supplied by the source. When C atoms, for example, are selected to be implanted 116 into the top region 117 to the selected depth 118, the dose energy may be selected to be in a range of from around 1.0 kiloelectron volts (keV) to around 12 keV. The intended level of the enhanced passivation of the top region 117 may be predetermined to be achieved by an average dose (e.g., density) of the implanted atoms above the selected depth 118. When the atoms to be implanted are C atoms, for example, the intended level of the enhanced passivation may be achieved by implantation 116 of the C atoms into the top region 117 in a range of from around $10^{14}$ per square centimeter ($cm^2$) to around $10^{16}/cm^2$. When the atoms to be implanted are other atoms (e.g., P, B, and/or As), the keV and densities may be adjusted accordingly to achieve the intended level of enhanced passivation for the top region 117 of the passivation material 110.

The top region 117 of the passivation material 110 into which the atoms are to be implanted 116 to the intended level is shown to extend to the selected depth 118 into the first portion 112 of the pillars 105. The selected depth 118 may, in a number of embodiments, be below an upper surface of the coating material 115-2 along the sidewalls 106 and below the top surface of the first portion 112 of each of the pillars 105. A particular depth below the upper surface of the coating material 115-2 to which the atoms are able to be implanted may depend on the type of atom being implanted, the dose energy applied to the atoms, the composition of the coating material 115-2, and/or the relative ability of the elements or compounds in the coating material 115-2 to block or absorb penetration of the selected atoms, among other possibilities.

The ability to implant 116 the atoms to the selected depth 118 below the top surface of the first portion 112 of the pillars 105 and/or the upper surface of the coating material 115-2 may be affected by an angle at which the source supplies (accelerates) the atoms relative to the axes of the pillars 105 and/or openings 107. For example, the source may utilize beam deposition from above an upper surface of the top region 117 to adjust implantation of the atoms of the element from being implanted 116-1 from substantially orthogonal to the upper surface of the top region 117 to being implanted 116-2 at an acute angle (e.g., an adjustment of ±20 degrees from orthogonal) relative to a sidewall 106 of the passivation material 110. As such, the atoms may be implanted into the top region 117 of the passivation material 110 to the selected depth 118 and to the intended density by adjustment of the angle of the beam deposition, while reducing (e.g., preventing) implantation of the atoms through the sidewall 106 below the selected depth 118 based on presence of the recessed coating material 115-2 along the sidewall 106 below the selected depth 118 of the intended level.

Figure 2:
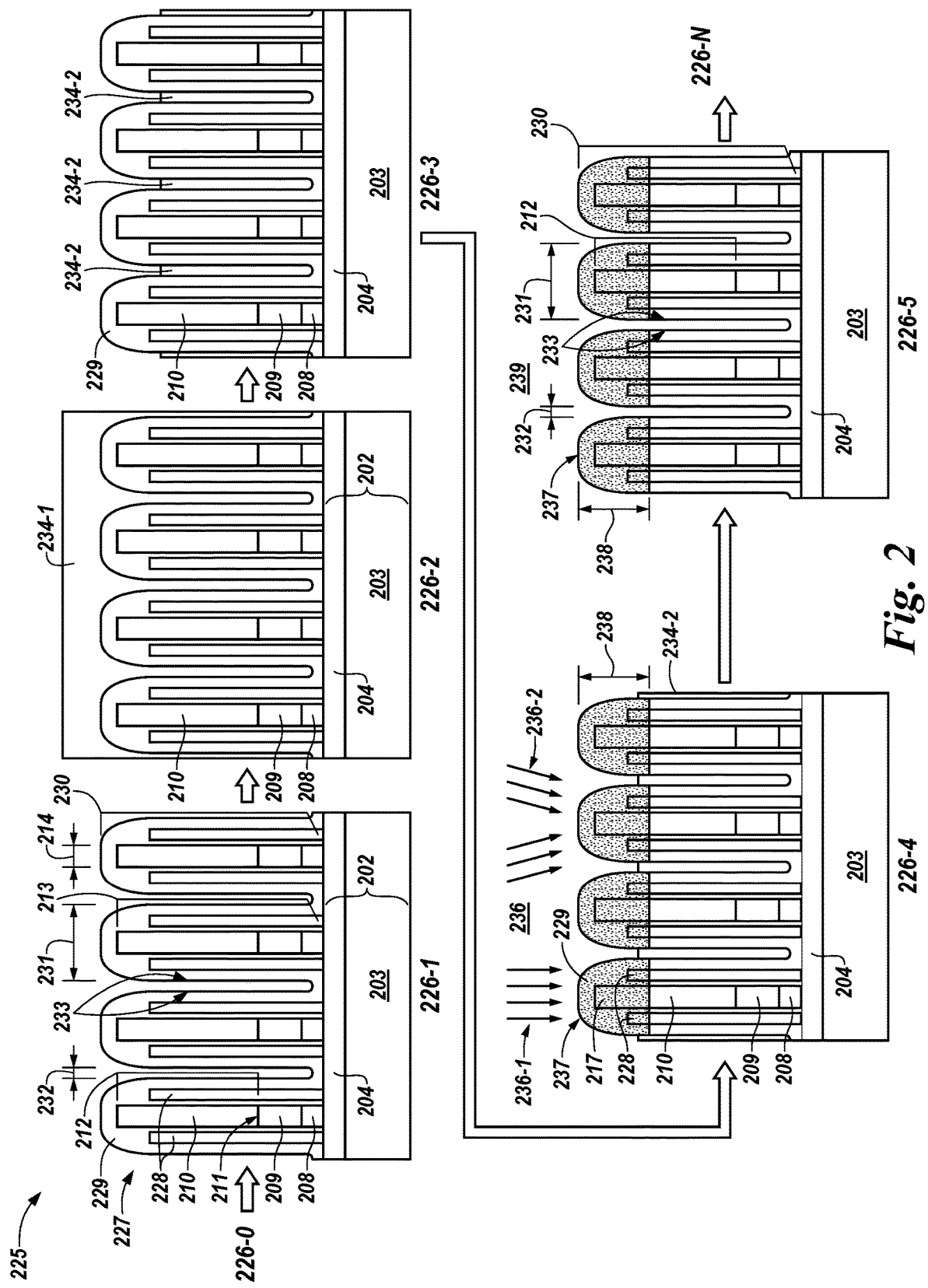
FIG. 2 illustrates a cross-sectional view of a portion of another example memory device at various points in time in another example fabrication sequence for atom implantation for passivation of pillar material in accordance with a number of embodiments of the present disclosure.

Point 101-5 of the fabrication sequence 100 illustrated in FIG. 1 shows removal 119 of the recessed coating material 115-2 from the openings 107. The removal 119 of the recessed coating material 115-2 may re-expose (e.g., relative to point 101-1 in time) the opposing sidewalls 106 and bottoms, on the upper surface of the substrate material 102, of each of the openings 107. The removal 119 may contribute to or enable formation of a plurality of separate access lines, sense lines, or electrodes (e.g., as shown and described in connection with FIG. 9) for the semiconductor memory device based on other processing activities in the fabrication sequence 100 being performed at subsequent points 101-N in time (e.g., as illustrated in FIG. 2 or otherwise).

The removal 119 of the recessed coating material 115-2 may be performed with an etch process on a SOC coating material using, for example, dry etch chemistries of $O_2$ or of $O_2$ and nitrogen ($N_2$) ($O_2/N_2$). Alternatively or in addition, the removal 119 of the SOC coating material may be performed by etching using a selective etch chemistry of ammonium hydroxide ($NH_4OH$) or hydrogen fluoride (HF) and/or by dissolving the SOC coating material using a selective solvent, for example $NH_4OH$ or HF, among other possible etch chemistries or solvents.

The enhanced passivation described herein may be an increased resistance to removal of all or part of the implanted region (e.g., top region 117) relative to resistance of the passivation material 110 (e.g., $Si_3N_4$, among other possible materials) of the pillar 105 prior to implantation of the atoms. The enhanced passivation of the top region 117 of the first portion 112 of the pillar 105 to the selected depth 118 by implantation 116 of the atoms may reduce unintended removal of material from the first portion 112 of the pillar 105 during the removal 119 of the recessed coating material 115-2 from the openings 107. For example, the implantation 116 of the atoms may confer increased resistivity to, in a number of embodiments, particular processes selected for the removal 119 of the recessed coating material 115-2.

As such, the enhanced passivation may be an increased resistance of the implanted region 117 to an etch process performed in a vicinity of the pillar 105. One or more of such etch processes may be utilized to recess the coating material 115-2 as shown at point 101-3 and/or to remove the recessed coating material 115-2 from the openings 107 as shown at point 101-5 in FIG. 1. Such etch processes may be utilized to recess the coating material 234-2 as shown at point 226-3 and/or to remove the recessed coating material 234-2 from the openings 232 as shown at point 226-5 in FIG. 2. The increased resistivity to various processes performed in the vicinity of the implanted regions and/or the pillars conferred by the enhanced passivation may reduce unintended effects such as, for example as shown in FIG. 1, reduction of the height 113 or width 114 of the pillar 105, or other effects on the sidewalls 106.

FIG. 2 illustrates a cross-sectional view of a portion of another example memory device at various points in time in another example fabrication sequence 225 for atom implantation for passivation of pillar material in accordance with a number of embodiments of the present disclosure. The fabrication sequence 225 illustrated in FIG. 2 is shown at points 226 in time that correspond to processing activities being performed in the fabrication sequence 225. The points 226 illustrate the structural features after various processing activities have been performed along the fabrication sequence 225. The fabrication sequence 225 may include repetition of particular fabrication processing activities (steps) through a number of iterations (cycles). Other processing activities may have been omitted from FIG. 2 for simplicity. The illustrated processing activities may correspond to formation and removal of structural features.

The points 226 in time illustrated in FIG. 2 begin at point 226-0. Point 226-0 may encompass processing activities in the fabrication sequence 225 that correspond, for example, to processing activities illustrated at points 101-0, . . . , 101-N as shown in FIG. 1 and/or points 341-1 and 341-2 as shown in FIG. 3. The fabrication sequence 225, however, is not limited to inclusion of such preceding processing activities. The points 226 in time illustrated in FIG. 2 may include subsequent points 226-N. Further processing activities performed to enable formation of, for example, separate access lines, sense lines, or electrodes for a semiconductor memory device based on other processing activities in the fabrication sequence 225 may be performed at the subsequent points 226-N (e.g., as illustrated in FIGS. 4-5 or otherwise).

Point 226-1 in time shows a plurality of pillars 227 of the portion of the example memory device formed on a substrate material 202. The plurality of pillars 227 may be separated by openings 232, as described herein, between the pillars 227. The separation of the pillars 227 provided by the openings 232 may have a width in a range of from around 160 A to around 200 A. The substrate material 202 may, in a number of embodiments, be formed from more than one material, such as the first layer 204 and second layer 203 described in connection with FIG. 1.

The pillars 227 shown in the fabrication sequence 225 may have a spacer material 229 and/or an oxide material 228 formed on or in association with a surface (e.g., a height) 213 of a first portion 212 and a second portion 209 of the pillars 227 shown in FIG. 2. In embodiments in which an oxide material 228 is used to form a number of sub-pillars within the pillar 227, the oxide material 228 may, for example, be formed from Sift and the spacer material 229 on both sides of each sub-pillar of the oxide material 228 may, for example, be formed from a nitride material (e.g., $Si_3N_4$, although embodiments of the nitride space material 229 described herein are not so limited). For simplicity, the nitride material and/or the oxide material formed in the vicinity of the first portion 212 and a second portion 209 of the pillars 227 may collectively be referred to herein as spacer material 229, as appropriate to the context. The pillars 227 formed as such may have a width 231 in a range of from around 200 A to around 400 A.

The cross-sectional view is intended to show that the spacer material 229 may, in a number of embodiments, be formed to surround a height 213 of the first portion 212 and the second portion 209 in three dimensions. In a number of embodiments, a height of each sub-pillar of the oxide material 228 may equal or be less than the height 213 of the first portion 212 and the second portion 209 within the pillar 227. A selected height of the oxide material 228 also may surround a selected height of the first portion 212 and the second portion 209 within the pillar 227.

The structural features may, for example, include the first portion 212 of the pillar 227. The first portion 212 is intended to distinguish a position of a passivation material 210 as being different from an underlying second portion formed from the conductive material 209 and a number of other possible portions of the pillar 227 that may be between the conductive material 209 and a substrate material 202 of the pillar 227. For simplicity, the underlying material (e.g., bottom portion 208) and the conductive material 209 of the pillar 227 may both be referred to as the second portion and use reference number "09," as appropriate to the context. The first portion 212 and/or the second portion 209 also are intended to be distinguishable from the spacer material 229 and the oxide material 228 of the pillar 227. The passivation material 210 may be formed on, or as, the first portion 212 of the pillar 227 as described at 112 in connection with FIG. 1. The passivation material 210 may be formed from $Si_3N_4$, although embodiments of the passivation material 210 described herein are not so limited.

In a number of embodiments, a bottom portion 208 may be included in the second portion 209 of the pillars 227 contiguous with the substrate material 202. The bottom portion 208 may be formed from, for example, a doped or undoped poly-Si to a thickness in a range of from around 100 A to around 200 A. The conductive material 209 of the second portion of the pillar 227 may be formed on a surface of the bottom portion 208 opposite from a surface of the bottom portion 208 contiguous to the substrate material 202. As described in connection with FIG. 1, the conductive material 209 may be formed from W, Cu, Ag, among various other conductive materials, and mixtures thereof, to a thickness in a range of from around 150 A to around 250 A.

The passivation material 210 of the first portion 212 of the pillar 227 may be formed on a surface of the conductive material 209 opposite from the surface of the bottom portion 208 on which the conductive material 209 may be formed. The passivation material 210 may, in a number of embodiments, be formed from $Si_3N_4$. The passivation material 210 may, for example, be formed to a thickness in a range of from around 650 A to around 850 A.

As described in connection with point 226-4, a top region 237 of the first portion 212 opposite from an interface 211 between the first portion 212 and the underlying second portion 209 may be implanted 236 with atoms of an element different from atoms included in the passivation material 210 to enhance passivation of the implanted top region 237. For example, in an embodiment in which the passivation material 210 is formed from $Si_3N_4$, the atoms implanted 236 into the $Si_3N_4$ passivation material 210, the spacer material 229, and/or the oxide material 228 of the top region 237 can be selected from a number of elements different from Si and N. The atoms of the selected elements that are different from Si and N may, in a number of embodiments, include at least one of C, P, B, and As, and various mixtures thereof, and may be implanted as neutral atoms, ionized atoms, or a mixture thereof.

Each pillar 227 may be formed to extend to a height 230 above an upper surface of the substrate material 202. For example, as just described, a pillar 227 may be formed from a first portion 212 and a second portion 209. Addition of a height of the first portion 212 and a height of the second portion 209 may be to a particular height 213 within the pillar 227. For example, the 650-850 A thickness of the passivation material 210 of the first portion 212 added to the combined thicknesses of 150-250 A for the conductive material 209 and 100-200 A for the bottom portion 208 of the second portion may yield a height 213 in a range of from around 900 A to around 1300 A. An additional height of the spacer material 229 in a range of from around 30 A to around 50 A formed over a top of the height of the first portion 212 may yield to a combined height 230 of 930-1350 A above the upper surface of the substrate material 202.

The height 230 of the pillar 227 may correspond to a depth of an adjacent opening 232. A width by which each pillar 227 is separated from another pillar may define a width of the opening 232 between sidewalls 233 of the pillars 227. The sidewalls 233 of the pillars 227 may alternatively be termed sidewalls 233 of the opening 232, depending on the context.

Each first portion 212 and second portion 209 within the pillar 227 may be formed to a particular width 214. The width 214 may be in a range of from around 70 A to around 100 A. A width of the oxide material 228 (e.g., $SiO_2$) that may form a sub-pillar on each side of the first portion 212 and second portion 209 within the pillar 227 may be formed to a width in a range of from around 30 A to around 50 A. In a number of embodiments, a width of the spacer material 229 (e.g., $Si_3N_4$) formed between the first portion 212 and second portion 209 and the oxide material 228 may be in a range of from around 10 A to around 30 A and a width of the spacer material 229 formed on a outside surface of the oxide material 228 may be in a range of from around 30 A to around 50 A. Adding these widths yields the total width of each pillar 227 being in the range of 200-400 A.

Deposition and etching may be utilized to form the pillars 227, the first portion 212 and second portion 209 within the pillar 227, spacer material 229, the oxide material 228, and the openings 232, etc. The height and width of the pillars 227, the width of the openings 232, and the thicknesses of the defined first portion 212 and second portion 209 within the pillar 227, the spacer material 229, and the oxide material 228 may vary according to an intended purpose, materials to be formed (e.g., deposited) therein, design rule specifications, etc.

Variation in the height 230 and/or width 231 of the pillar 227 determine an AR of the pillar 227 based on the height 230 relative to the width 231. The AR for the pillars 227 shown in FIG. 2 to be implanted 236 with atoms for enhanced passivation may, for example, be 930 A/200 A=4.7 or 1350 A/400 A=3.4, with other possible lower or higher ARs resulting from variation in the height 230 in the 930-1350 A range relative to the width 231 in the 200-400 A range.

Given a particular width 231 of a pillar 227, a difference in an AR may be based on the height (thickness) of the passivation material 210 of the first portion 212 of the pillar 227 being less based on the top region 237 of the first portion 212 being implanted 236 with atoms to enhance passivation than an AR resulting from the first portion 212 not being implanted to enhance passivation (e.g., as shown and described in connection with FIGS. 3-5). As described herein, such a reduction in the AR resulting from reduction of the height of the passivation material 210 may enable a reduced probability of an unintended bend, roughness, and/or failure of the pillar 227.

The fabrication sequence 225 illustrated in FIG. 2 shows at the point 226-2 in time that a coating material 234-1 that includes atoms of an element different from the atoms used to originally form the passivation material 210, the spacer material 229, and/or the oxide material 228 is formed (e.g., deposited) to fill the openings 232 to at least an upper surface of the spacer material 229 for the pillars 227. For example, in embodiments in which the passivation material 210 is formed from $Si_3N_4$, the coating material 234-1 may be formed from, or to include, atoms of elements different from Si and N. The coating material 234-1 shown in FIG. 2 may be the same the coating material 115-1 shown in FIG. 1 or may be a different coating material. The coating material 234-1 may be formed from a level of a substrate material 202 of the pillar 227 to an intended level along the height 230 of the pillar 227. The intended height may, in a number of embodiments, be along the sidewalls 233 of the openings 232 in the pillars 227, or above top surfaces of the spacer material 229, to reduce implantation of the atoms through the spacer material 229 and/or the sidewalls 233 below the intended level.

Various types of materials may be utilized as the coating material 234-1 to fill the openings 232 to the intended level relative to the height 230 of the pillar 227. A particular coating material may be selected based on satisfaction of particular criteria described in connection with FIG. 1 or otherwise. The coating material 234-1 may be selected (e.g., configured) to be removable after the atoms are implanted into the top region 237 of the pillars 227.

Point 226-3 of the fabrication sequence 225 illustrated in FIG. 2 shows an example of the intended level of the coating material 234-2 along the sidewalls 233 and below the top surface of the spacer material 229 of each of the pillars 227. The intended level of the coating material 234-2 may, in a number of embodiments, be recessed below the top surface of the spacer material 229 in a range of from around 230 A to around 450 A.

The recessed level of the coating material 234-2 may be achieved by performance of a deposition process (e.g., a spin-on process or another deposition process described herein or otherwise) that is designed for and/or continued until reaching the recessed level. Alternatively or in addition, when the height of the coating material 234-2 is above the top surface of the spacer material 229, at point 226-2 in FIG. 2, the recessed level of the coating material 234-2 may be achieved by performance of a selective etch process. As described herein, the selective etch process may have one or more etch chemistries selected from an aqueous etch chemistry, a semi-aqueous etch chemistry, a vapor etch chemistry, or a plasma etch chemistries, among other possible selective etch chemistries.

Point 226-4 of the fabrication sequence 225 illustrated in FIG. 2 shows an example of the selected atoms being implanted 236 into the top region 237 of the pillars 227. As described herein, being implanted 236 into the top region 237 of a pillar 227 may include being implanted into a top region of the spacer material 229, a top region of the oxide material 228, and/or a top region 217 of the passivation material 210 above a selected depth 238 (e.g., relative to a top surface of the spacer material 229 on the pillars 227). The atoms may be implanted 236 from a source (not shown) positioned above the memory device relative to axes of the pillars 227 and/or openings 232. The source may be operated as described in connection with FIG. 1 or otherwise.

The atoms in the top region 237 may be implanted 236 to an intended (e.g., selected) depth 238 and/or to an intended density after formation of the spacer material 229 on the first portion 212 and the second portion 209 of the pillar 227. The number and/or density of atoms, for example, to be implanted 236 into the top region 237 above the selected depth 238 may be predetermined to enhance the passivation of the implanted top region 237 to an intended level. A capability of achieving the preselected density of atoms implanted into the top region 237 above the selected depth 238 or a time period spent in doing so may be dependent upon an implant energy supplied by the source, as described in connection with FIG. 1 or otherwise. The intended level of the enhanced passivation of the top region 237 may be predetermined to be achieved by an average dose (e.g., density) of the implanted atoms above the selected depth 238, as described in connection with FIG. 1 or otherwise.

The top region 217 of the passivation material 210 into which the atoms are to be implanted 236 to the intended level is shown to extend to the selected depth 238 into the first portion 212 of the pillars 227. The selected depth 238 may, in a number of embodiments, be below an upper surface of the coating material 234-2 along the sidewalls 233 and below the top surface of the first portion 212 of each of the pillars 227. In a number of embodiments, the top region 237 of the pillar 227 into which the atoms are to be implanted 236 to the intended level may extend to the selected depth 238 into the spacer material 229 and/or the oxide material 228. A particular depth below the upper surface of the coating material 234-2 to which the atoms are able to be implanted may depend on the type of atom being implanted, the dose energy applied to the atoms, the composition of the coating material 234-2, and/or the relative ability of the elements or compounds in the coating material 234-2 to block or absorb penetration of the selected atoms, among other possibilities.

The ability to implant 236 the atoms to the selected depth 238 below the top surface of the spacer material 229 of the pillars 227 and/or the upper surface of the coating material 234-2 may be affected by an angle at which the source supplies (accelerates) the atoms relative to the axes of the pillars 227 and/or openings 232. For example, the source may utilize beam deposition from above an upper surface of the top region 237 to adjust implantation of the atoms of the element from being implanted 236-1 from substantially orthogonal to the upper surface of the top region 237 to being implanted 236-2 at an acute angle (e.g., an adjustment of ±20 degrees from orthogonal) relative to a sidewall 233 of an opening 232. As such, the atoms may be implanted into the top region 237 to the selected depth 238 and to the intended density by adjustment of the angle of the beam deposition, while reducing (e.g., preventing) implantation of the atoms through the spacer material 229 and/or the sidewall 233 below the selected depth 238 based on presence of the recessed coating material 234-2 below the selected depth 238 of the intended level.

Point 226-5 of the fabrication sequence 225 illustrated in FIG. 2 shows removal 239 of the recessed coating material 234-2 from the openings 232. The removal 239 of the recessed coating material 234-2 may re-expose (e.g., relative to point 226-1 in time) the opposing sidewalls 233 and bottoms, on the upper surface of the substrate material 202, of each of the openings 232. The removal 239 may contribute to or enable formation of a plurality of separate access lines, sense lines, or electrodes (e.g., as shown and described in connection with FIG. 9) for the semiconductor memory device based on other processing activities in the fabrication sequence 225 being performed at subsequent points 226-N in time (e.g., as illustrated in FIGS. 4-5 or otherwise). The removal 239 of the recessed coating material 234-2 may be performed with an etch process using etch chemistries and/or using a selective solvent, as described in connection with FIG. 1 or otherwise.

The enhanced passivation described herein may be an increased resistance to removal of all or part of the implanted top region 237 (e.g., the spacer material 229, the passivation material 210, and/or the oxide material 228) relative to resistance of the materials of the top region of the pillar 227 prior to implantation of the atoms. The enhanced passivation of the top region 237 of the pillar 227 to the selected depth 238 by implantation 236 of the atoms may reduce unintended removal of material from the top region 237 of the pillar 227 during the removal 239 of the recessed coating material 234-2 from the spacer material 229 and/or the openings 232. For example, the implantation 236 of the atoms may confer increased resistivity to, in a number of embodiments, particular processes selected for the removal 239 of the recessed coating material 234-2.

As such, the enhanced passivation may be an increased resistance of the implanted region 237 to an etch process performed in a vicinity of the pillar 227. One or more of such etch processes may be utilized to recess the coating material 234-2 as shown at point 226-3 and/or to remove the recessed coating material 234-2 from the openings 232 as shown at point 226-5 in FIG. 2. Such etch processes may be utilized to recess the coating material 234-2 as shown at point 226-3 and/or to remove the recessed coating material 234-2 from the openings 232 as shown at point 226-5 in FIG. 2. Alternatively or in addition, such etch processes may be utilized to make the opening deeper. For example, as shown in FIG. 4, an opening 432 between pillars 427 as shown at point 451-1 may be etched as shown at point 451-2 to deepen the opening 453 (e.g., into the first layer 404 and/or the second layer 403 of the substrate material 402). The enhanced passivation also may be an increased resistance of the implanted region to a chemical mechanical polishing (CMP) process performed in a vicinity of the implanted region (e.g., as shown and described in connection with FIG. 5). The increased resistivity to various processes performed in the vicinity of the implanted regions and/or the pillars conferred by the enhanced passivation may reduce unintended effects such as, for example as shown in FIG. 2, reduction of the height 230 or width 231 of the pillar 227, or other effects on the sidewalls 233.

FIG. 3 illustrates a cross-sectional view of a portion of an example memory device in a fabrication sequence 340 upstream from FIG. 1 in accordance with a number of embodiments of the present disclosure. The fabrication sequence 340 illustrated in FIG. 3 is shown at points 341 in time that correspond to processing activities being performed in the fabrication sequence 340.

The points 341 illustrate the structural features after various processing activities have been performed along the fabrication sequence 340. The processing activities in the fabrication sequence 340 may be performed prior to performance of the processing activities of fabrication sequence 100 described and illustrated in connection with FIG. 1, although embodiments of the fabrication sequences described in connection with FIG. 1 and FIG. 2 are not limited by fabrication sequence 340 illustrated in FIG. 3. Other processing activities may have been omitted from FIG. 3 for simplicity. The illustrated processing activities may correspond to formation and removal of structural features. The processing activities of the fabrication sequence 340 shown in FIG. 3 are intended to illustrate an example of a fabrication sequence in which enhanced passivation of the pillar material by implantation of atoms, as described herein, is not performed.

The points 341 in time illustrated in FIG. 3 begin at point 341-0. Point 341-0 may encompass processing activities in the fabrication sequence 340 that correspond, for example, to processing activities performed prior to initiation of the processing activities illustrated in FIGS. 1-2 and 4-5. The fabrication sequence 340, however, is not limited to inclusion of such preceding processing activities. The points 341 in time illustrated in FIG. 3 may include subsequent points 341-N. Further processing activities performed to enable formation of, for example, separate access lines, sense lines, or electrodes for a semiconductor memory device based on other processing activities in the fabrication sequence 340 may be performed at the subsequent points 341-N (e.g., as illustrated in FIGS. 1-2 and 4-5 or otherwise).

Formation of structural features shown at point 341-1 in time may, in a number of embodiments, include deposition of a second substrate material 304 (e.g., a layer formed from $SiO_2$) on a first substrate material 303 (e.g., a wafer formed from Si), possibly following other processing activities performed at the 341-0 point in time. The $SiO_2$ of the second substrate material 304 and the Si of the first substrate material 303 each may be formed to a thickness in a range of from around 50-150 A to yield a combined 100-300 A thickness of the substrate material 302.

In a number of embodiments, a bottom portion 308 of an intended pillar 346 may be deposited on an exposed surface of the second substrate material 304. The bottom portion 308 may be formed from, for example, a doped or undoped poly-Si to a thickness in a range of from around 100 A to around 200 A. A conductive material 309 may be deposited on a surface of the bottom portion 308 opposite from a surface of the bottom portion 308 contiguous to the substrate material 302, where the bottom portion 308 combined with the conductive material 309 may form a second portion 347 (e.g., as described in connection with FIGS. 1 and 2) of the intended pillar 346. As further described in connection with FIGS. 1 and 2, the conductive material 309 may be formed from W, Cu, Ag, among various other conductive materials, and mixtures thereof, to a thickness in a range of from around 150 A to around 250 A.

A passivation material 310 may be deposited on an exposed surface of the conductive material 309 such that an interface 311 is formed between a first portion 346 and the underlying second portion 347 of the intended pillar 346. The passivation material 310 may, in a number of embodiments, be formed from $Si_3N_4$. The passivation material 310 may, for example, be formed to a thickness in a range of from around 800 A to around 1000 A. The 800-1000 A thickness of the passivation material 310 illustrated in FIG. 3 (e.g., the height of the first portion 348) is greater than the 650-850 A thickness of the passivation materials 110, 210 of the first portions 112, 212 of the pillars 105, 227 illustrated in FIGS. 1 and 2, respectively.

The thickness of the passivation material 310 illustrated in FIG. 3 is greater than the thickness of the passivation materials 110, 210 illustrated in FIGS. 1 and 2 because the passivation material 310 will not have a top region 117, 237 protected from removal by implantation of atoms therein. Without such protection, some of the top region, including some of the passivation material 310, may be removed, for example, by performance of the etch, solvent, and/or CMP processes shown and described in connection with FIGS. 1-2 and 4-5, among other possible processes. Hence, the passivation material 310 shown in FIG. 3 may be thicker relative to the thickness of the passivation materials 110, 210 illustrated in FIGS. 1 and 2 to compensate for performance of such processes in which enhanced passivation of the pillar material by implantation of atoms is not performed.

The fabrication sequence 340 illustrated in FIG. 3 also may include deposition of a mask material 342 on an exposed surface of the passivation material 310. The mask material 342 may originally be formed as a layer over consecutive layers of the passivation material 310, the conductive material 309, etc. The mask material 342 may be patterned (e.g., etched) to remove intended portions of the mask material 342 to form columns 343 on the passivation material 310. The columns 343 of the mask material 342 may be patterned such that the columns 343 are separated by an intended distance 344 and such that the columns 343 have an intended width 345 suitable for the intended pillars 346 being formed (e.g., etched) to have the intended width 345 and the openings 307 having their sidewalls 306 separated by the intended distance 344. The mask material 342 and the columns 343 formed therefrom may, in a number of embodiments, be formed from carbon (C), which may be combined with other elements or compounds (e.g., based upon a particular etch process to be performed), or the mask material 342 and the columns 343 may be formed from a suitable material other than C.

The mask material 342 and the columns 343 may be formed to a thickness in a range of from around 800 A to around 1000 A. The 800-1000 A thickness of the mask material 342 and the columns 343 illustrated in FIG. 3 is greater than a 650-850 A thickness of the mask material 342 and the columns 343 that may be utilized in formation of the corresponding pillars 105, 227 that include the 650-850 A thickness of the passivation materials 110, 210 of the first portions 112, 212 of the pillars 105, 227. The thickness of the mask material 342 may be reduced by around 150 A because the thickness of the passivation materials 110, 210 is also reduced by around 150 A relative to the 800-1000 A thickness of the passivation material 310 shown in FIG. 3. The reduced thickness of the passivation materials 110, 210 may thereby result in less time for etching of the passivation materials 110, 210 and result in a correspondingly reduced thickness of mask material 342 for protection of the passivation materials 110, 210.

Point 341-2 in FIG. 3 illustrates formation of the portion of the example memory device in the fabrication sequence 340 based on performance of an etch process described in connection with the preceding point 341-1. Performance of the etch process using the mask material 342 for protection of the passivation material 310 of the first portion 348 may result in formation of a plurality of pillars 346. Each of the pillars 346 may have a width 345 based on a corresponding width 345 of the columns 343 of the mask material 342 and the separation of the sidewalls 306 of the pillars 346 (e.g., the width of the openings 307) may correspond to the distance 344 between the columns 343 of the mask material 342.

The thickness (height) of the passivation material 310 of the first portion 348 is greater than corresponding heights of the passivation materials 110, 210 described in connection with FIGS. 1 and 2. Hence, the height 349 of the pillar 346 including the first portion 348 and the second portion 347 is greater than the corresponding heights 113, 213 of the pillars 105, 227 described in connection with FIGS. 1 and 2, respectively. A portion of the mask material 342 remaining after performance of the etch process further increases a total height of the pillar 346.

The greater height 349 of the pillar 346 relative to the corresponding heights 113, 213 of the pillars 105, 227, combined with their comparable widths 114, 214, 345, may increase the AR of the first portion 348 and second portion 347 of the pillar 346 relative to the corresponding first and second portions of the pillars 105, 227 described in connection with FIGS. 1 and 2, respectively. For example, as previously presented, the AR for the pillars 105 shown in FIG. 1 to be implanted 116 with atoms for enhanced passivation may be 900 A/70 A=12.9 or 1300 A/100 A=13.0, resulting from the height 113 in the 900-1300 A range relative to the width 114 in a 70-100 A range. In contrast, just based on the 150 A increase in the thickness of the passivation material 310 shown in FIG. 3, the AR of the pillars 346 may be increased to 1050 A/70 A=15.0 or 1450 A/100 A=14.5. The increased AR during formation of the pillars 346 without the enhanced passivation of the pillar material may contribute to an increased probability of an unintended bend or roughness formed on the sidewall 306 of the pillar 346. Such an unintended bend or roughness may contribute to an increased probability of failure (e.g., a short circuit fault) of the pillar 346 relative to such a probability when the top region of the passivation material or the top region of the pillar is implanted with atoms to enhance the passivation capability thereof, as described herein.

Figure 4:
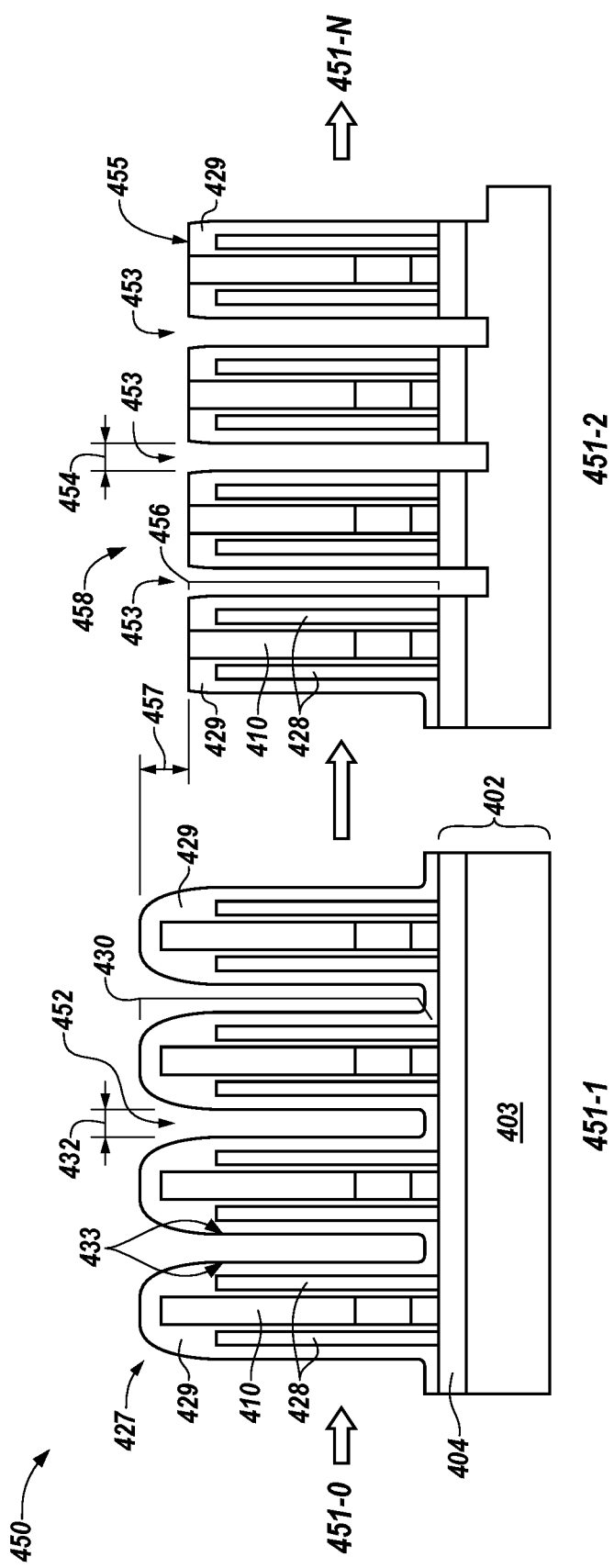
FIG. 4 illustrates a cross-sectional view of a portion of an example memory device in a fabrication sequence potentially downstream from FIG. 2 without enhanced passivation of the pillar material in accordance with a number of embodiments of the present disclosure.

FIG. 4 illustrates a cross-sectional view of a portion of an example memory device in a fabrication sequence 450 potentially downstream from FIG. 2 without enhanced passivation of the pillar material in accordance with a number of embodiments of the present disclosure. The fabrication sequence 450 illustrated in FIG. 4 is shown at points 451 in time that correspond to processing activities being performed in the fabrication sequence 450.

The points 451 illustrate the structural features after various processing activities have been performed along the fabrication sequence 450. The processing activities in the fabrication sequence 450 may be performed after performance of the processing activities of fabrication sequences 100 and 225 described and illustrated in connection with FIGS. 1 and 2, respectively, although embodiments of the fabrication sequences described in connection with FIGS. 1 and 2 are not limited by fabrication sequence 450 illustrated in FIG. 4. Other processing activities may have been omitted from FIG. 4 for simplicity. The illustrated processing activities may correspond to formation and removal of structural features. The processing activities of the fabrication sequence 450 shown in FIG. 4 are intended to illustrate an example of a fabrication sequence in which enhanced passivation of the pillar material by implantation of atoms, as described herein, is not performed.

The points 451 in time illustrated in FIG. 4 begin at point 451-0. Point 451-0 may encompass processing activities in the fabrication sequence 450 that correspond, for example, to processing activities illustrated at points 101-0 and 101-1 as shown in FIG. 1, points 226-0 and 226-1 as shown in FIG. 2, and/or points 341-1 and 341-2 as shown in FIG. 3. The fabrication sequence 450, however, is not limited to inclusion of such preceding processing activities. The points 451 in time illustrated in FIG. 4 may include subsequent points 451-N. Further processing activities performed to enable formation of, for example, separate access lines, sense lines, or electrodes for a semiconductor memory device based on other processing activities in the fabrication sequence 450 may be performed at the subsequent points 451-N (e.g., as illustrated in FIG. 5 or otherwise).

The structural features shown at point 451-1 in time may, in a number of embodiments, correspond to the structural features shown at point 226-1 in the fabrication sequence 225 illustrated and described in connection with FIG. 2. As such, the pillar 427 including the passivation material 410, the spacer material 429, and/or the oxide material 428 may be formed to extend to a height 430 above an upper surface of the substrate material 402.

An etch process 458 is illustrated at point 451-2 as having been performed on each of the openings 432 between the plurality of pillars 427. The etch process 458 may be performed to deepen the openings 453 (e.g., into the first material 404 and/or the second material 403 of the substrate material 402). The pillar 427 has not been implanted with atoms to enhance the passivation of a top region 117, 237 thereof, as shown and described in connection with FIGS. 1 and 2, respectively. Because the top region of each of the pillars 427 has not been implanted with atoms to enhance passivation thereof, the top region may not have increased resistance to being removed by the etch process 458. Hence, while deepening the openings 453, the etch process 458 also may remove material from the top region of each of the pillars 427 (e.g., from the top of the passivation material 410, the spacer material 429, and/or the oxide material 428). As a result of the material being removed from the top region of each of the pillars 427, the resulting pillars 455 may have a reduced height 456.

Exposure to the etch process 458 to deepen the openings 453 between the pillars 427 having height 430 may thus cause an unintended decrease 457 in the height to the reduced height 456 of the pillars 455 following the etch. Exposure to the etch process 458 also may result in an unintended widening of the openings 454 between the pillars 427. Enhancement of the passivation of the top region of the pillars 427 (e.g., as shown and described in connection with the top region 237 at points 226-4 and 226-5 in FIG. 2) may increase the resistance of the top region to the etch process 458 such that the unintended decrease 457 in the height 456 and/or the unintended widening of the openings 454 may have been reduced (e.g., prevented).

Figure 5:
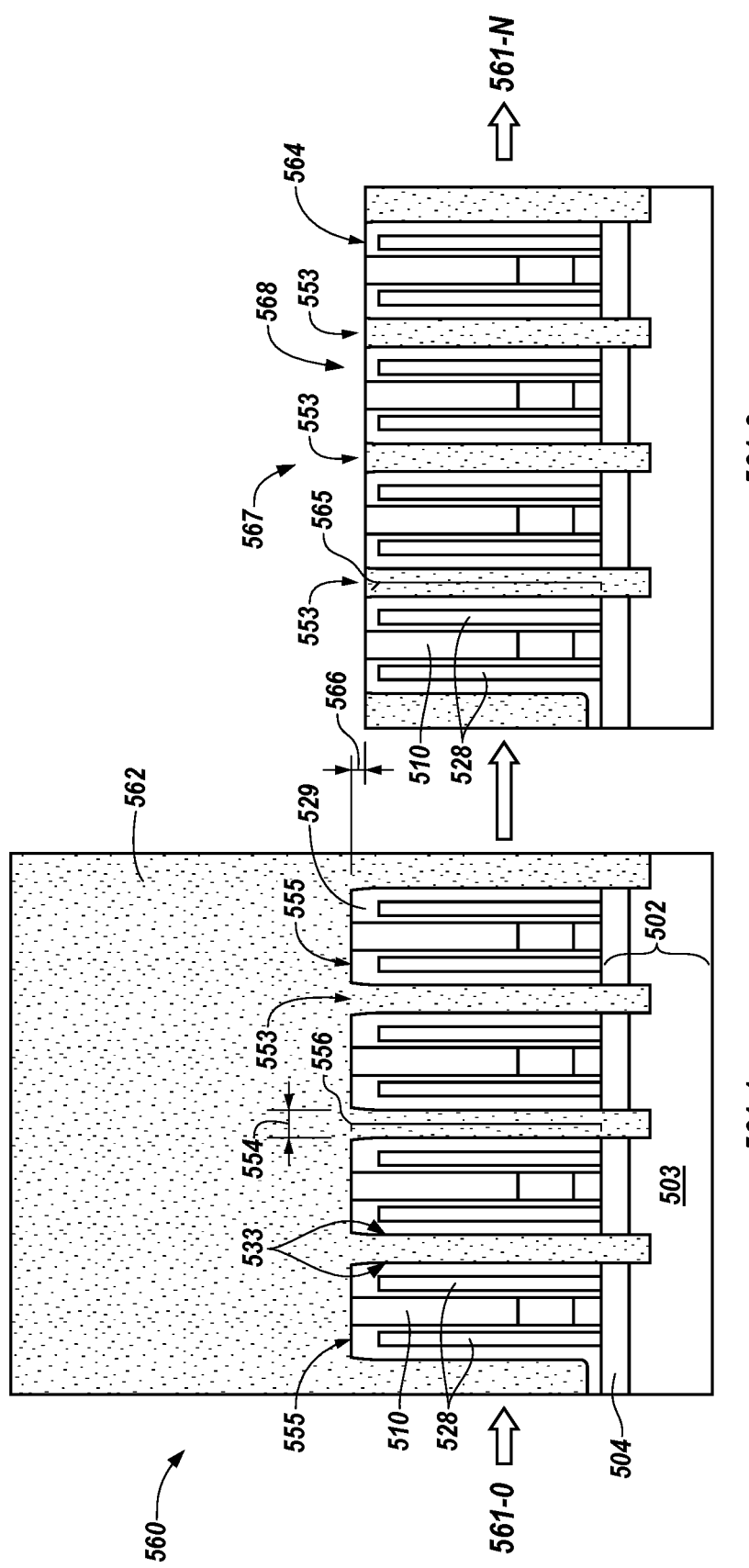
FIG. 5 illustrates a cross-sectional view of a portion of another example memory device in a fabrication sequence potentially downstream from FIG. 2 without enhanced passivation of the pillar material in accordance with a number of embodiments of the present disclosure.

FIG. 5 illustrates a cross-sectional view of a portion of another example memory device in a fabrication sequence 560 potentially downstream from FIG. 2 without enhanced passivation of the pillar material in accordance with a number of embodiments of the present disclosure. The fabrication sequence 560 illustrated in FIG. 5 is shown at points 561 in time that correspond to processing activities being performed in the fabrication sequence 560.

The points 561 illustrate the structural features after various processing activities have been performed along the fabrication sequence 560. The processing activities in the fabrication sequence 560 may be performed either after performance of the processing activities of fabrication sequences 100 and 225 described and illustrated in connection with FIGS. 1 and 2, respectively, or after performance of the processing activities of fabrication sequence 450 described and illustrated in connection with FIG. 4, although embodiments of the fabrication sequences described in connection with FIGS. 1-2 and 4 are not limited by fabrication sequence 560 illustrated in FIG. 5 or vice versa. Other processing activities may have been omitted from FIG. 5 for simplicity. The illustrated processing activities may correspond to formation and removal of structural features. The processing activities of the fabrication sequence 560 shown in FIG. 5 are intended to illustrate an example of a fabrication sequence in which enhanced passivation of the pillar material by implantation of atoms, as described herein, is not performed.

The points 561 in time illustrated in FIG. 5 begin at point 561-0. Point 561-0 may encompass processing activities in the fabrication sequence 560 that correspond, for example, to processing activities illustrated at points 101-0 and 101-1 as shown in FIG. 1, points 226-0 and 226-1 as shown in FIG. 2, points 341-1 and 341-2 as shown in FIG. 3, and/or points 451-1 and 451-2 as shown in FIG. 4. The fabrication sequence 560, however, is not limited to inclusion of such preceding processing activities. The points 561 in time illustrated in FIG. 5 may include subsequent points 561-N. Further processing activities performed to enable formation of, for example, separate access lines, sense lines, or electrodes for a semiconductor memory device based on other processing activities in the fabrication sequence 560 may be performed at the subsequent points 561-N not illustrated herein.

The structural features shown at point 561-1 in time may, in a number of embodiments, correspond to the structural features shown at point 451-2 in the fabrication sequence 450 illustrated and described in connection with FIG. 4. As such, the pillar 555 including the passivation material 510, the spacer material 529, and/or the oxide material 528 may extend to the reduced height 556 above the upper surface of the substrate material 502.

Point 561-1 also shows that a material 562 has been formed (e.g., deposited) to cover the structural features shown at point 451-2. The material 562 may be deposited prior to performance of a CMP process. The material 562 may, in a number of embodiments, be formed from Sift, among other possible materials suitable for use during the CMP process. The material 562 may be formed to a thickness in a range of from around 2500 A to around 4000 A.

A CMP process 567 is illustrated at point 561-2 as having been performed on a top surface 568 of the example memory device above each of the plurality of pillars 555 and each of the openings 553 between the pillars 555. The CMP process 567 may be performed using one or more of the etch processes described herein and/or with mechanical polishing to remove the material 562 from the top surface 568 above the pillars 555 and openings 553 (e.g., and to leave remaining material 562 to fill the openings 553 to the level of the substrate material 502).

The pillar 555 has not been implanted with atoms to enhance the passivation of a top region 117, 237 thereof, as shown and described in connection with FIGS. 1 and 2, respectively. Because the top region of each of the pillars 555 has not been implanted with atoms to enhance passivation thereof, the top region may not have increased resistance to being removed by the CMP process 567. Hence, while removing the material 562 from above the pillars 555 and openings 553, the CMP process 567 also may remove material from the top region of each of the pillars 555 (e.g., from the top of the passivation material 510, the spacer material 529, and/or the oxide material 528). As a result of the material being removed from the top region of each of the pillars 555, the resulting pillars 564 may have a reduced height 565.

Exposure to the CMP process 567 to remove the material 562 from above the openings 553 and pillars 555 having height 556 may thus cause an unintended decrease 566 in the height to the reduced height 565 of the pillars 564 following the CPM process 567. Enhancement of the passivation of the top region of the pillars 555 (e.g., as shown and described in connection with the top region 237 at points 226-4 and 226-5 in FIG. 2) may increase the resistance of the top region to the CMP process 567 such that the unintended decrease 566 in the height of the openings pillars 564 may have been reduced (e.g., prevented).

Figure 6:
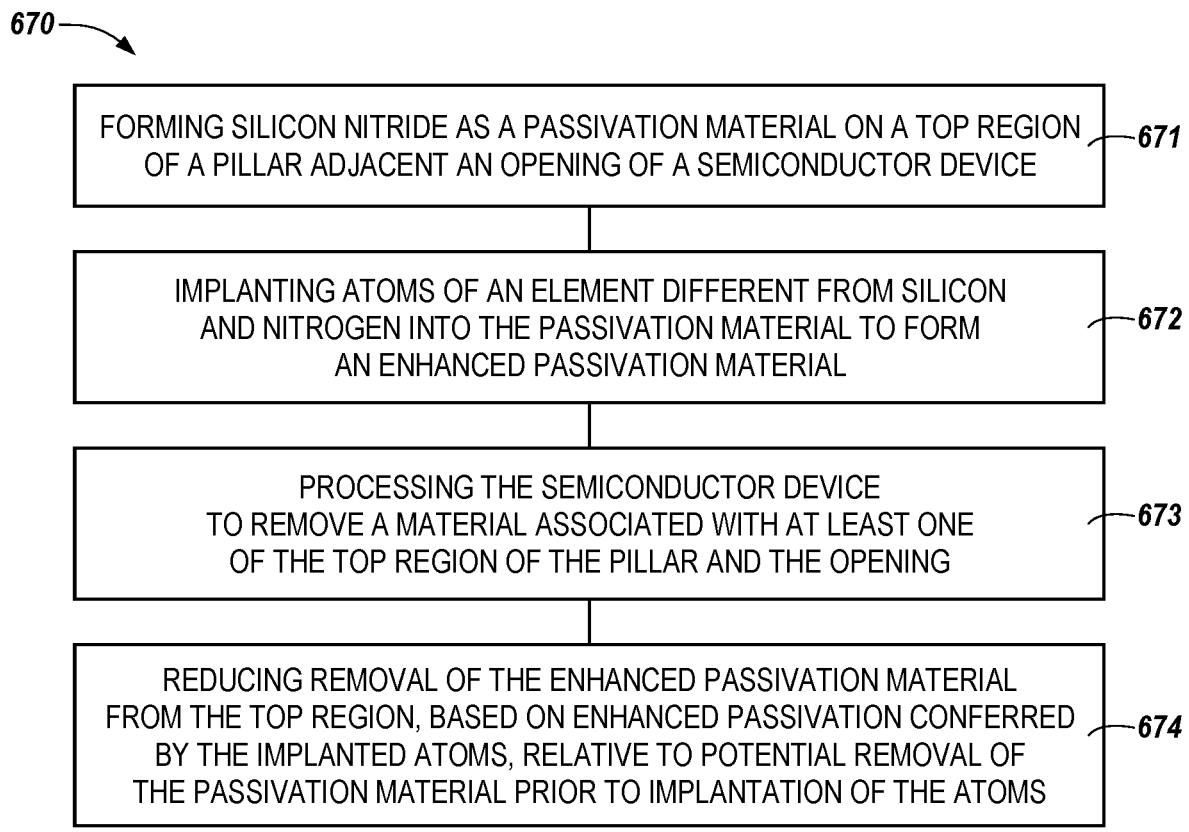
FIG. 6 is a flow diagram of an example method for using atom implantation for passivation of pillar material in accordance with a number of embodiments of the present disclosure.

FIG. 6 is a flow diagram of an example method 670 for using atom implantation for passivation of pillar material in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 671, the method 760 may include forming $Si_3N_4$ as a passivation material on a top region of a pillar adjacent an opening of a semiconductor device (e.g., as described in connection with point 101-1 in FIG. 1, point 226-1 in FIG. 2, and point 341-1 in FIG. 3). At block 672, the method 670 may include implanting atoms of an element different from Si and N into the passivation material to form an enhanced passivation material (e.g., as described in connection with point 101-4 in FIG. 1 and point 226-4 in FIG. 2). At block 673, the method 670 may include processing the semiconductor device to remove a material associated with at least one of the top region of the pillar and the opening (e.g., as described in connection with point 101-5 in FIG. 1, point 226-5 in FIG. 2, point 341-2 in FIG. 3, point 451-2 in FIG. 5, and point 561-2 in FIG. 5). At block 674, the method 670 may include reducing removal of the enhanced passivation material from the top region, based on enhanced passivation conferred by the implanted atoms, relative to potential removal of the passivation material prior to implantation of the atoms (e.g., as described in connection with point 101-5 in FIG. 1, point 226-5 in FIG. 2, point 341-2 in FIG. 3, point 451-2 in FIG. 5, and point 561-2 in FIG. 5).

The method 670 may, in a number of embodiments, further include forming a conductive material on a surface of a substrate material and forming the $Si_3N_4$ as the passivation material on an opposite surface of the conductive material to protect the conductive material from the processing (e.g., as described in connection with point 101-1 in FIG. 1, point 226-1 in FIG. 2, and point 341-1 in FIG. 3). The conductive material may, in a number of embodiments, be configured to operate as at least one of an access line, a sense line, and an electrode for the semiconductor memory device, as described herein.

The method 670 may further include depositing a coating material, including the atoms of the element different from Si and N, to fill the opening to at least an upper surface of the top region (e.g., as described in connection with point 101-2 in FIG. 1 and point 226-2 in FIG. 2). The method 670 may further include etching the coating material to an intended level along a height of a sidewall of the passivation material to expose the upper surface of the top region and the sidewall above the intended level (e.g., as described in connection with point 101-3 in FIG. 1 and point 226-3 in FIG. 2).

The method 670 may further include implanting atoms of the element through an upper surface of the top region and a sidewall of the passivation material (e.g., as described in connection with point 101-4 in FIG. 1 and point 226-4 in FIG. 2). The method 670 may further include reducing implantation of the atoms through the sidewall below an intended level based on presence of a coating material deposited in the opening and along the sidewall to the intended level (e.g., as described in connection with point 101-4 in FIG. 1 and point 226-4 in FIG. 2).

The method 670 may further include reducing a thickness of the passivation material formed on the top region of the pillar. The thickness may be reduced based on the enhanced passivation conferred by the implanted atoms, relative to a thickness of the $Si_3N_4$ prior to implantation that potentially provides passivation equivalent to the enhanced passivation (e.g., as described in connection with point 101-5 in FIG. 1, point 226-5 in FIG. 2, point 341-2 in FIG. 3, point 451-2 in FIG. 5, and point 561-2 in FIG. 5). Based on reduction of the thickness of the top region, an AR of a height of the pillar to a width of the pillar may be reduced. Reduction of the AR may contribute to a reduction of a probability of an unintended bend of the pillar. Reduction of the AR also may contribute to a reduction of a probability for roughness being formed on a sidewall of the pillar by processing to remove the material associated with the opening.

Figure 7:
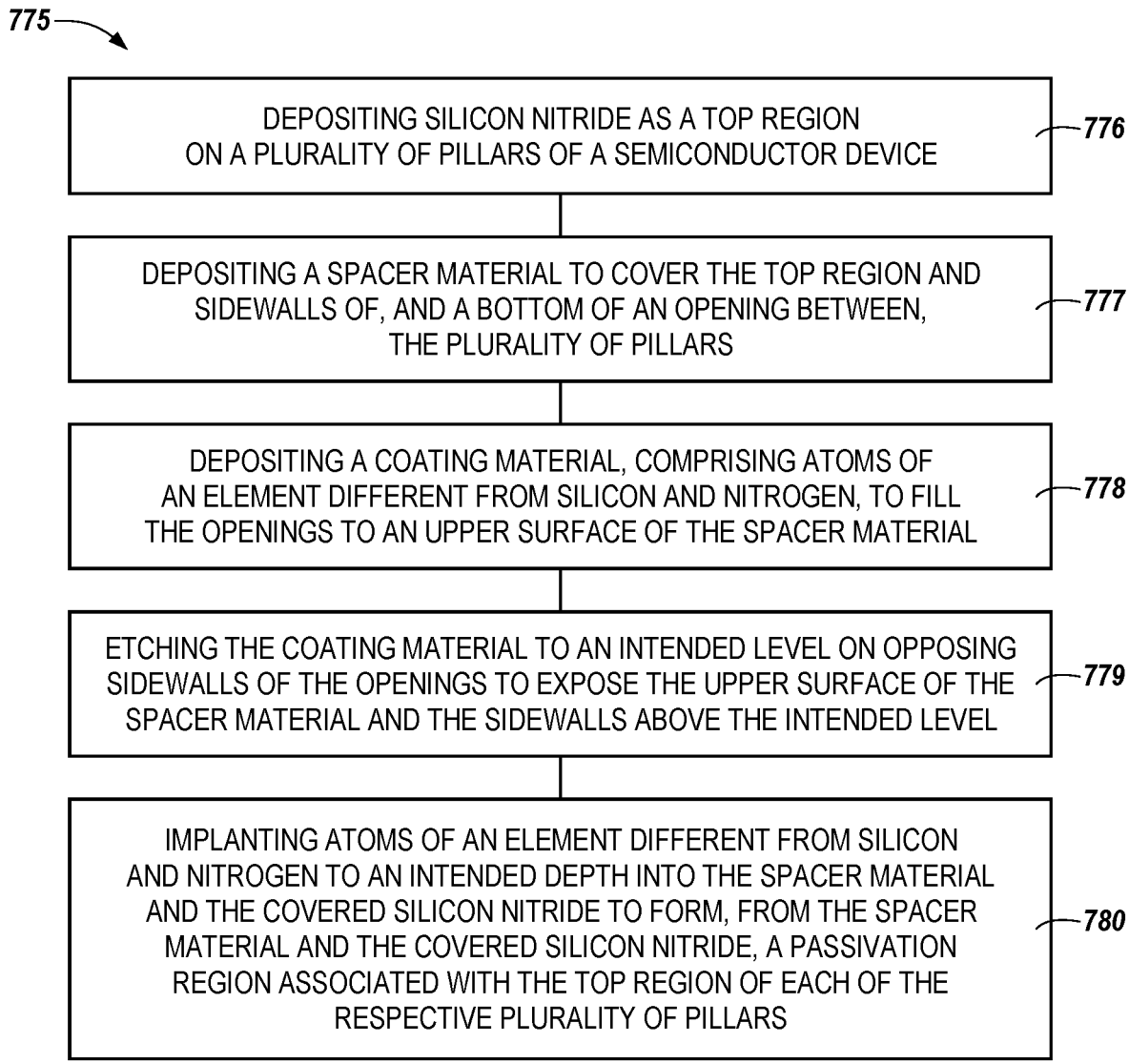
FIG. 7 is a flow diagram of another example method for using atom implantation for passivation of pillar material in accordance with a number of embodiments of the present disclosure.

FIG. 7 is a flow diagram of another example method 775 for using atom implantation for passivation of pillar material in accordance with a number of embodiments of the present disclosure. At block 776, the method 775 may include depositing $Si_3N_4$ as a top region on a plurality of pillars of a semiconductor device (e.g., as described in connection with point 226-1 in FIG. 2 and point 341-1 in FIG. 3). At block 777, the method 775 may include depositing a spacer material to cover the top region and sidewalls of, and a bottom of an opening between, the plurality of pillars (e.g., as described in connection with point 226-1 in FIG. 2 and point 451-1 in FIG. 4). At block 778, the method 775 may include depositing a coating material, including atoms of an element different from Si and N, to fill the openings to an upper surface of the spacer material (e.g., as described in connection with point 226-2 in FIG. 2). At block 779, the method 775 may include etching the coating material to an intended level on opposing sidewalls of the openings to expose the upper surface of the spacer material and the sidewalls above the intended level (e.g., as described in connection with point 226-3 in FIG. 2). At block 780, the method 775 may include implanting atoms of an element different from Si and N to an intended depth into the spacer material and the covered $Si_3N_4$ to form, from the spacer material and the covered $Si_3N_4$, a passivation region associated with the top region of each of the respective plurality of pillars (e.g., as described in connection with point 226-4 in FIG. 2).

The method 775 may, in a number of embodiments, further include forming the spacer material from a nitride material that extends from a substrate material on which the plurality of pillars is formed to cover the top region of each of the respective plurality of pillars (e.g., as described in connection with point 226-1 in FIG. 2 and point 451-1 in FIG. 4). The method 775 may further include forming the spacer material from the nitride material to cover an oxide material that extends along a height of a sidewall of each of the pillars covered by the spacer material (e.g., as described in connection with point 226-1 in FIG. 2 and point 451-1 in FIG. 4). The method 775 may further include implanting the atoms of the element to an intended depth into the nitride material and the oxide material of the spacer material, and into the covered $Si_3N_4$, to form the passivation region for each of the respective plurality of pillars (e.g., as described in connection with point 226-4 in FIG. 2).

The method 775 may further include processing the semiconductor device to remove a material associated with at least one of the spacer material, on each of the respective plurality of pillars, and the openings (e.g., as described in connection with point 226-5 in FIG. 2, point 451-2 in FIG. 5, and point 561-2 in FIG. 5). The method 775 may further include reducing removal of materials that form the passivation regions associated with the top region of each of the respective plurality of pillars relative to potential removal of the materials prior to formation of the passivation regions by implantation of the atoms (e.g., as described in connection point 226-5 in FIG. 2, point 451-2 in FIG. 5, and point 561-2 in FIG. 5). The method 775 may further include removing the coating material to re-expose the spacer material on the opposing sidewalls and bottoms of each of the respective openings to enable formation of a plurality of separate access lines, sense lines, or electrodes for the semiconductor memory device (e.g., as described in connection point 226-5 in FIG. 2).

Figure 8:
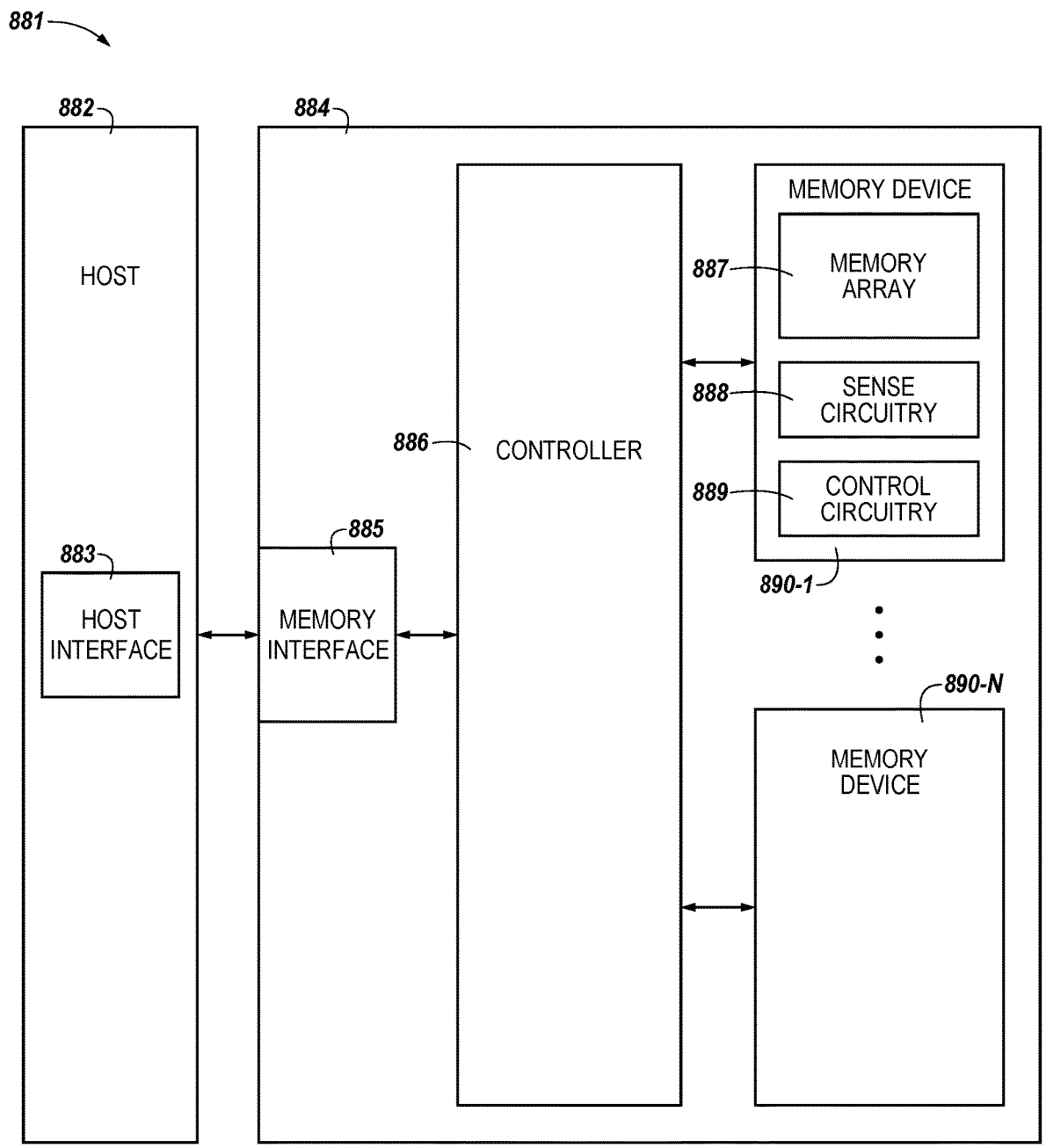
FIG. 8 is a functional block diagram of a computing system including at least one memory system in accordance with one or more embodiments of the present disclosure.

FIG. 8 is a functional block diagram of a computing system 881 including at least one memory system 884 in accordance with one or more embodiments of the present disclosure. Memory system 884 may be, for example, a solid-state drive (SSD).

In the embodiment illustrated in FIG. 8, memory system 884 includes a memory interface 885, a number of memory devices 890-1, . . . , 890-N, and a controller 886 selectably coupled to the memory interface 885 and memory devices 890-1, . . . , 890-N. Memory interface 885 may be used to communicate information between memory system 884 and another device, such as a host 882. Host 882 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like. Such a host 882 may be associated with fabrication operations performed on semiconductor devices and/or SSDs using, for example, a processing apparatus.

In a number of embodiments, host 882 may be associated with (e.g., include or be coupled to) a host interface 883. The host interface 883 may enable input of scaled preferences (e.g., in numerically and/or structurally defined gradients) to define, for example, critical dimensions (CDs) of a final structure or intermediary structures of a memory device (e.g., as shown at 890) and/or an array of memory cells (e.g., as shown at 887) formed thereon. The scaled preferences may be provided to the host interface 883 via input of a number of preferences stored by the host 882, input of preferences from another storage system (not shown), and/or input of preferences by a user (e.g., a human operator).

Memory interface 885 may be in the form of a standardized physical interface. For example, when memory system 884 is used for information (e.g., data) storage in computing system 881, memory interface 885 may be a serial advanced technology attachment (SATA) interface, a peripheral component interconnect express (PCIe) interface, or a universal serial bus (USB) interface, among other physical connectors and/or interfaces. In general, however, memory interface 885 may provide an interface for passing control, address, information, scaled preferences, and/or other signals between the controller 886 of memory system 884 and a host 882 (e.g., via host interface 883).

Controller 886 may include, for example, firmware and/or control circuitry (e.g., hardware). Controller 886 may be operably coupled to and/or included on the same physical device (e.g., a die) as one or more of the memory devices 890-1, . . . , 890-N. For example, controller 886 may be, or may include, an ASIC as hardware operably coupled to circuitry (e.g., a printed circuit board) including memory interface 885 and memory devices 890-1, . . . , 890-N. Alternatively, controller 886 may be included on a separate physical device that is communicatively coupled to the physical device (e.g., the die) that includes one or more of the memory devices 890-1, . . . , 890-N.

Controller 886 may communicate with memory devices 890-1, . . . , 890-N to direct operations to sense (e.g., read), program (e.g., write), and/or erase information, among other functions and/or operations for management of memory cells. Controller 886 may have circuitry that may include a number of integrated circuits and/or discrete components. In a number of embodiments, the circuitry in controller 886 may include control circuitry for controlling access across memory devices 890-1, . . . , 890-N and/or circuitry for providing a translation layer between host 882 and memory system 884.

Memory devices 890-1, . . . , 890-N may include, for example, a number of memory arrays 887 (e.g., arrays of volatile and/or non-volatile memory cells). For instance, memory devices 890-1, . . . , 890-N may include arrays of memory cells, such as a portion of an example memory device 991 structured to include pillars and adjacent trenches described in connection with FIG. 9. As will be appreciated, the memory cells in the memory arrays 887 of memory devices 890-1, . . . , 890-N and/or as shown at 991 may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory devices 890, 991 may be formed on the same die. A memory device (e.g., memory device 890-1) may include one or more arrays 887 of memory cells formed on the die. A memory device may include sense circuitry 888 and control circuitry 889 associated with one or more arrays 887 formed on the die, or portions thereof. The sense circuitry 888 may be utilized to determine (sense) a particular data value (e.g., 0 or 1) that is stored at a particular memory cell in a row of an array 887. The control circuitry 889 may be utilized to direct the sense circuitry 888 to sense particular data values, in addition to directing storage, erasure, etc., of data values in response to a command from host 882 and/or host interface 883. The command may be sent directly to the control circuitry 889 via the memory interface 885 or to the control circuitry 889 via the controller 886.

The embodiment illustrated in FIG. 8 may include additional circuitry that is not illustrated so as not to obscure embodiments of the present disclosure. For example, memory devices 890, 991 may include address circuitry to latch address signals provided over I/O connectors through I/O circuitry. Address signals may be received and decoded by a row decoder and a column decoder to access a memory array 887. It will be appreciated that the number of address input connectors may depend on the density and/or architecture of memory devices 890, 991 and/or memory arrays 887.

Figure 9:
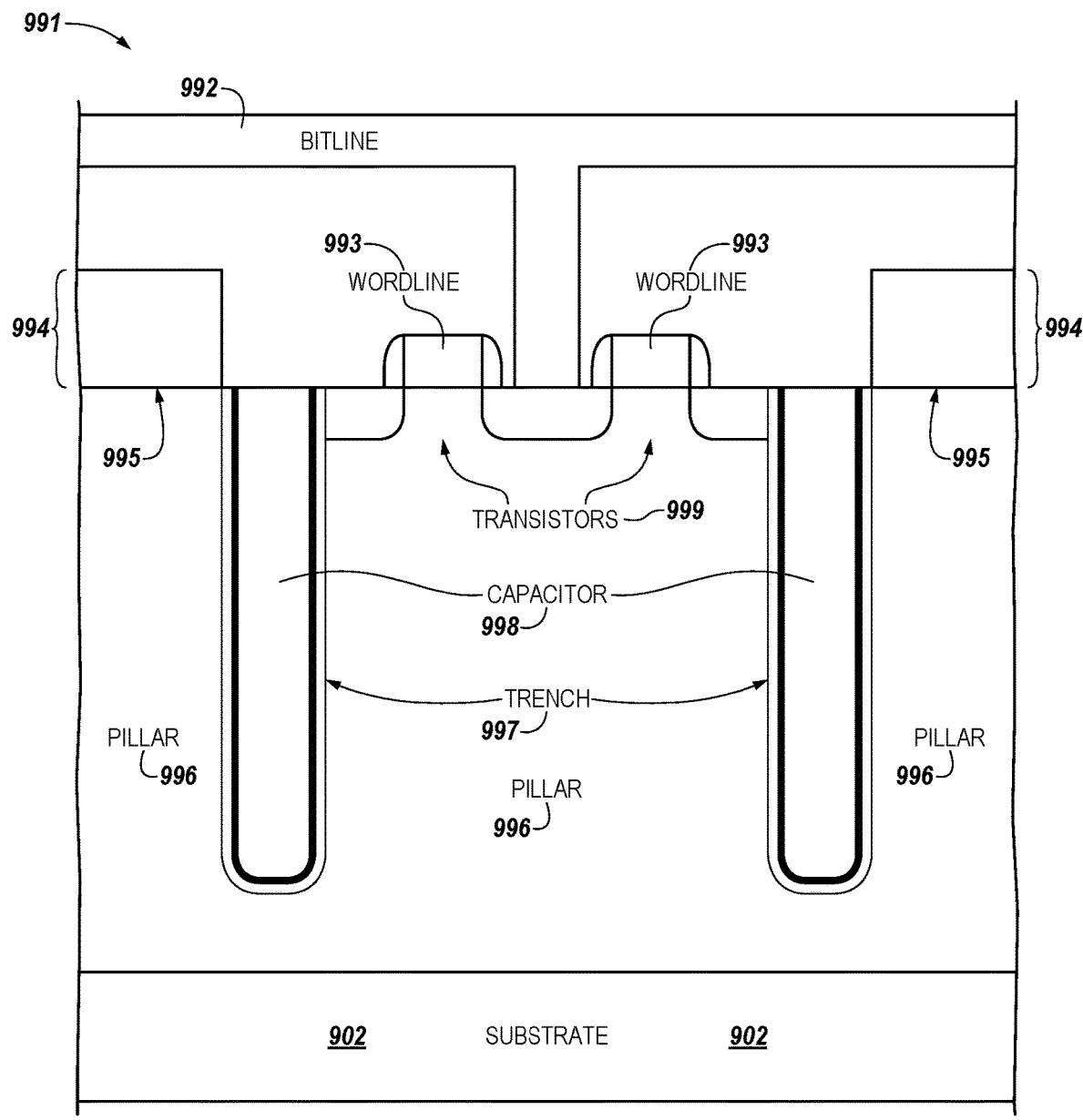
FIG. 9 illustrates a cross-sectional view of a portion of an example of semiconductor structures of a memory device that include pillars and adjacent trenches in accordance with a number of embodiments of the present disclosure.

FIG. 9 illustrates a cross-sectional view of a portion of an example of semiconductor structures of a memory device 991 that include pillars and adjacent trenches in accordance with a number of embodiments of the present disclosure. The portion of the memory device 991 illustrated in FIG. 9 is shown by way of example and not by way of limitation to include a DRAM memory cell architecture. Another RAM, flash (e.g., NAND or NOR), and/or 3D memory cell architecture also may include pillars and adjacent trenches. Embodiments are not so limited. Although the DRAM transistors 999 and capacitors 998 are shown to be arranged in a lateral configuration, embodiments may include the transistors 999 and capacitors 998 being arranged in a lateral, a vertical, or any other configuration.

The portion of the memory device 991 shown in FIG. 9 may represent two DRAM memory cells in a 1T1C (one transistor one capacitor) configuration or one DRAM memory cell in a 2T2C configuration. DRAM memory cells may utilize capacitors 998 each formed in a trench 997 to store a particular charge corresponding to a data value. Forming the trenches 997 as shown in FIG. 9 may result in a pillar 996 being formed from the etched material on each side of a trench 997. Pillars 996 may be formed (e.g., fabricated) as layers of doped or undoped semiconductor material deposited on a substrate material 902, which may be the same or different from the substrate material 102 shown and described in connection with FIG. 1 and elsewhere herein. The semiconductor material may be etched to form the pillars 996 and trenches 997. In some embodiments, an opening (e.g., a round, square, oblong, etc., opening rather than a rectilinear trench) may be etched into the semiconductor material and capacitor material may be deposited in the opening, although such a configuration does not affect the concept of enhanced passivation of a pillar material described herein.

Moreover, embodiments of the present disclosure are not limited to capacitors being formed in a trench for data storage, nor are embodiments limited to the trench containing capacitor material. For example, various types of memory devices may include trenches between sidewall structures (e.g., pillars) in which various materials may be positioned to contribute to data access, storage, and/or processing or in which various materials may be formed for electrical conduction and/or isolation (e.g., conductor, resistor, and/or dielectric materials), among other functions and/or operations.

In a number of embodiments, a trench 997 may be etched to a particular depth into a pillar material. The trench 997 may be etched into the material of the pillars 996 to a depth approaching the substrate material 902, as shown in FIG. 9. Alternatively, the trench 997 may be etched into the material of the pillars 996 to a top of or into the substrate material 902. The depth of the trench 997 approaching, at the top of, and/or into the substrate material 902 is in the bottom region of the trench.

As described herein, deepening (e.g., etching) the trench further into the pillar material or the substrate material may increase a surface area of the trench boundaries. In one example, increasing the surface area of the trench boundaries may increase a capacitance of a capacitor 998 formed in the trench 997 (e.g., by increasing a volume and/or surface area of the capacitor). In a number of embodiments, the trench 997 may be lined with a dielectric material (e.g., as indicated by the bold line) and a capacitor material may be formed (e.g., deposited) within the trench 997 and on the dielectric material to form the capacitor 998 to a particular (e.g., target) depth.

Each pillar 996 of the pillar material may extend to a particular height above the substrate material 902. As such, each pillar 996 has a top surface 995 at the particular height. A number of structural materials may be formed on or in association with the top surface 995 of the pillar 996 adjacent the trench 997. For example, a particular material 994 may be formed to contribute to data access, storage, and/or processing (e.g., conductor, resistor, and/or dielectric materials). Such a material 994 may be formed on the top surface 995 of the pillar 996 adjacent the trench 997. A mask material (not shown) may be formed to protect an underlying particular material 994 and/or the top surface 995 of the pillar 996 adjacent the trench 997 from subsequent processing and/or wear encountered in use of the memory device 991. Other structural materials may be formed (e.g., in a DRAM configuration as shown in FIG. 9) on or in association with the top surface 995 of the pillar 996 adjacent the trench 997. The other structural materials may include the transistors 999, access lines 993 (e.g., word lines), and sense lines 992 (e.g., bit lines), among other possible structural materials. The other structural materials may include electrodes (not shown), as described herein. The electrodes may be electrically coupled to the access lines 993 and/or sense lines 992 or the electrodes may be electrically coupled to other components of the memory device 991 and/or of the computing system 881 described in connection with FIG. 8.

Figure 10:
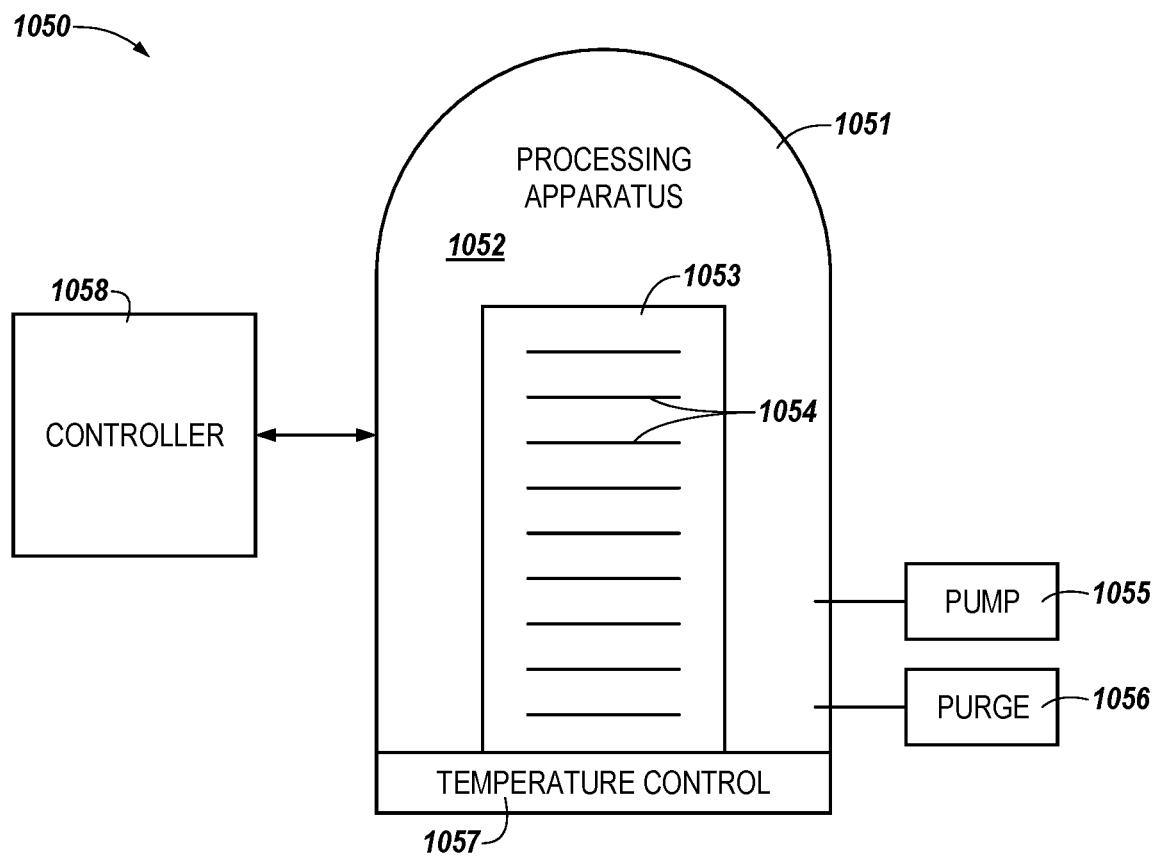
FIG. 10 is a functional block diagram of a system for implementation of an example semiconductor fabrication process in accordance with a number of embodiments of the present disclosure.

FIG. 10 is a functional block diagram of a system 1050 for implementation of an example semiconductor fabrication process in accordance with a number of embodiments of the present disclosure. The numbering convention used in connection with FIG. 10 does not follow the earlier introduced numbering convention and sequence that applies to FIGS. 1-9. The system 1050 may include a processing apparatus 1051. The processing apparatus 1051 may be configured to enable formation of structural materials on and/or removal of structural materials from a semiconductor device during fabrication of the semiconductor device.

The processing apparatus 1051 may include a chamber 1052 to enclose components configured to perform deposition or etch operations, in addition to atom deposition operations, on a number of semiconductor devices (e.g., wafers on which memory devices 890 and 991 or arrays 887 are being formed by the example semiconductor fabrication sequences described herein). The chamber 1052 may further enclose a carrier 1053 to hold a batch of semiconductor wafers 1054. The processing apparatus 1051 may include and/or be associated with tools including, for example, a pump 1055 unit and a purge 1056 unit configured to introduce and remove appropriate deposition chemistries and etch chemistries, as described herein, at each point in the semiconductor fabrication sequence. The processing apparatus 1051 may further include a temperature control 1057 unit configured to maintain the chamber 1052 at an appropriate temperature at each of the points in the fabrication sequences 100 and 225. The system 1050 may include a number of chambers 1052 that are each configured to perform particular processes (e.g., a wet etch process, a dry etch process, and/or a deposition process, among others) during the fabrication sequence.

The system 1050 may further include a controller 1058. The controller 1058 may include, or be associated with, circuitry and/or programming for implementation of, for instance, deposition and removal of materials related to atom implantation for passivation material of pillar material, including etching of various materials. Adjustment of such deposition, removal, and etching operations by the controller 1058 may control the CDs of the semiconductor devices created in the processing apparatus 1051.

A host may be configured to generate instructions related to atom implantation for passivation material of pillar material. An example of a host is shown at 882 in FIG. 8, although embodiments are not limited to being coupled to the memory system 884 shown in FIG. 8. The instructions may be sent via a host interface 883 to the controller 1058 of the processing apparatus 1051. The instructions may be based at least in part on scaled preferences (e.g., in numerically and/or structurally defined gradients) stored by the host 882, provided via input from another storage system (not shown), and/or provided via input from a user (e.g., a human operator), among other possibilities. The controller 1058 may be configured to enable input of the instructions and scaled preferences to define the CDs of the fabrication of the semiconductor device to be implemented by the processing apparatus 1051.

The scaled preferences may determine final structures (e.g., the CDs) of the top region of the pillar, a depth of atom implantation into the top region, a sidewall of the pillar, a width of the pillar, a width of the opening, and/or a depth of the opening, among the various other structural features described herein. Particular CDs may be enabled by the particular scaled preferences that are input via the instructions. Receipt and implementation of the scaled preferences by the controller 1058 may result in corresponding adjustment, by the processing apparatus 1051, of a deposition time for various materials, adjustment of the depth of atom implantation, adjustment of a coverage area, height, and/or volume of the various materials, adjustment of a trim direction and/or trim time performed on the various materials, and/or adjustment of etch direction and/or etch time performed on the various materials, among implementation of other possible scaled preferences.

The controller 1058 may, in a number of embodiments, be configured to use hardware as control circuitry. Such control circuitry may, for example, be an application specific integrated circuit (ASIC) with logic to control fabrication steps, via associated deposition and etch processes, related to atom implantation for passivation of pillar material, along with formation of the various materials on and removal of the various materials from the semiconductor device.

The controller 1058 may be configured to receive the instructions and direct performance of operations, corresponding to the instructions, by the processing apparatus 1051. The controller 1058 may be configured to implement the instructions to control a quantity of the various materials that are formed on and removed from the semiconductor device.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. Moreover, the structural features illustrated in the accompanying drawings are intended to indicate relative positioning of the structural features in one or more embodiments and are not necessarily drawn to scale relative to other structural features in the drawings or otherwise.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically for access to and/or for movement (transmission) of instructions (e.g., control signals, address signals, etc.) and data, as appropriate to the context.

While example embodiments including various combinations and configurations of structural materials, passivation materials, atoms to be implanted into the passivation materials, semiconductor materials, substrate materials, mask materials, Si-based materials, pillar materials, conductive materials, resistor materials, dielectric materials, capacitor materials, memory devices, memory cells, pillars, top regions of pillars, openings, sidewalls of the pillars and/or openings, among other materials and/or components related to atom implantation for passivation of pillar material, have been illustrated and described herein, embodiments of the present disclosure are not limited to those combinations explicitly recited herein. Other combinations and configurations of the structural materials, passivation materials, atoms to be implanted into the passivation materials, semiconductor materials, substrate materials, mask materials, Si-based materials, pillar materials, conductive materials, resistor materials, dielectric materials, capacitor materials, memory devices, memory cells, pillars, top regions of pillars, openings, sidewalls of the pillars and/or openings, among other materials and/or components related to atom implantation for passivation of pillar material than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    forming silicon nitride as a passivation material on a conductive material on a surface of a substrate in a fabrication process for a semiconductor structure;
    forming vertical openings through the passivation material and the conductive material to the substrate to form pillar structures;
    depositing a spin-on carbon (SOC) coating material to a level along sidewalls of the pillar structures leaving exposed a top region of the passivation material;
    implanting atoms, including atoms of carbon, into the passivation material to form an enhanced passivation material to a selected depth between a bottom surface of a remaining portion of the passivation material and a top surface of the remaining portion of the passivation material; and removing the SOC coating material from the vertical openings in the fabrication process for the semiconductor structure, wherein implanting the atoms to form the enhanced passivation material provides increased resistance to removal of the enhanced passivation material during removal of the coating material.

2. The method of claim 1, further comprising forming the silicon nitride as the passivation material on an upper surface of the conductive material to protect the conductive material from subsequent actions in the fabrication process for the semiconductor structure; and forming the conductive material to operate as at least one of an access line, a sense line, or an electrode for a semiconductor memory device.

3. The method of claim 1, further comprising etching the SOC coating material to the level along a sidewall of the remaining portion of the passivation material in the pillar structures to expose a larger portion of the sidewall of the remaining portion of the passivation material above the level.

4. The method of claim 1, further comprising depositing the SOC coating material to block the implanting of the atoms of carbon below the selected depth.

5. The method of claim 1, further comprising:

utilizing beam deposition from above an upper surface of the remaining portion of the passivation material to adjust implantation of the atoms, including the atoms of carbon, from substantially orthogonal to an upper surface of the remaining portion of the passivation material to an acute angle relative to the sidewall of the remaining portion of the passivation material in the pillar structures formed by the vertical openings;

implanting the atoms into the remaining portion of the passivation material to the selected depth and to an intended density of the atoms by adjustment of an angle of the beam deposition relative to the upper surface and the sidewall; and reducing implantation of the atoms, including the atoms of carbon, through the sidewall below the selected depth due to the deposited SOC coating material in the vertical openings blocking the sidewall below the selected depth.

6. The method of claim 5, further comprising implanting atoms, including the atoms of carbon, using a molecular beam epitaxy.

7. The method of claim 1, wherein implanting the atoms further includes implanting atoms of phosphorus (P).

8. The method of claim 1, wherein implanting the atoms further includes implanting atoms of boron (B).

9. The method of claim 1, wherein implanting the atoms further includes implanting atoms of arsenic.

* * * * *